(12) United States Patent
Bird et al.

(10) Patent No.: US 10,843,459 B2
(45) Date of Patent: Nov. 24, 2020

(54) DROPLET DEPOSITION APPARATUS AND TEST CIRCUIT THEREFOR

(71) Applicant: Xaar Technology Limited, Cambridge (GB)

(72) Inventors: Neil Christopher Bird, Cambridge (GB); Mujahid-ul Islam, Cambridge (GB)

(73) Assignee: XAAR TECHNOLOGY LIMITED, Cambridge (GB)

( * ) Notice: Subject to any disclaimer, the term of this patent is extended or adjusted under 35 U.S.C. 154(b) by 0 days.

(21) Appl. No.: 16/314,314

(22) PCT Filed: Jun. 29, 2017

(86) PCT No.: PCT/GB2017/051911
§ 371 (c)(1),
(2) Date: Dec. 28, 2018

(87) PCT Pub. No.: WO2018/002634
PCT Pub. Date: Jan. 4, 2018

(65) Prior Publication Data
US 2019/0202199 A1    Jul. 4, 2019

(30) Foreign Application Priority Data
Jun. 30, 2016    (GB) .................................. 1611464.7

(51) Int. Cl.
*B41J 2/045*    (2006.01)
*G01R 27/26*    (2006.01)
*G01R 31/28*    (2006.01)

(52) U.S. Cl.
CPC ........... *B41J 2/0451* (2013.01); *B41J 2/0455* (2013.01); *B41J 2/04508* (2013.01);
(Continued)

(58) Field of Classification Search
CPC .... B41J 2/0451; B41J 2/0455; B41J 2/04508; B41J 2/04541; B41J 2/04581; G01R 27/2605; G01R 31/2829
See application file for complete search history.

(56) References Cited

U.S. PATENT DOCUMENTS

| 7,014,290 B2 | 3/2006 | Chen et al. |
| 2006/0221142 A1 | 10/2006 | Katayama |

(Continued)

FOREIGN PATENT DOCUMENTS

| CN | 105426570 | 3/2016 |
| JP | 2007301741 | 11/2007 |
| WO | WO 2013/154586 A1 | 10/2013 |

OTHER PUBLICATIONS

International Search Report and Written Opinion dated Sep. 20, 2017, in International Application No. PCT/GB2017/051911 (10 pages.).

(Continued)

*Primary Examiner* — Bradley W Thies
(74) *Attorney, Agent, or Firm* — Finnegan, Henderson, Farabow, Garrett & Dunner LLP

(57) ABSTRACT

A test circuit to determine the capacitance of an actuator element in an actuator element array, wherein the test circuit comprises: a controller; a source to generate test inputs; measurement circuitry to measure one or more test values on a test path between the test circuit and the actuator element; wherein the controller is configured to, for a test period: control a first switch associated with the actuator element to connect the actuator element to the test path; control the source to generate a first test input; and determine a total capacitance of the actuator element from a first test value generated in response to the first test input; and determine the capacitance of the actuator element ($C_{ACT}$) from the total capacitance ($C_{PAR}+C_{ACT}$).

26 Claims, 13 Drawing Sheets

Figure 1A:
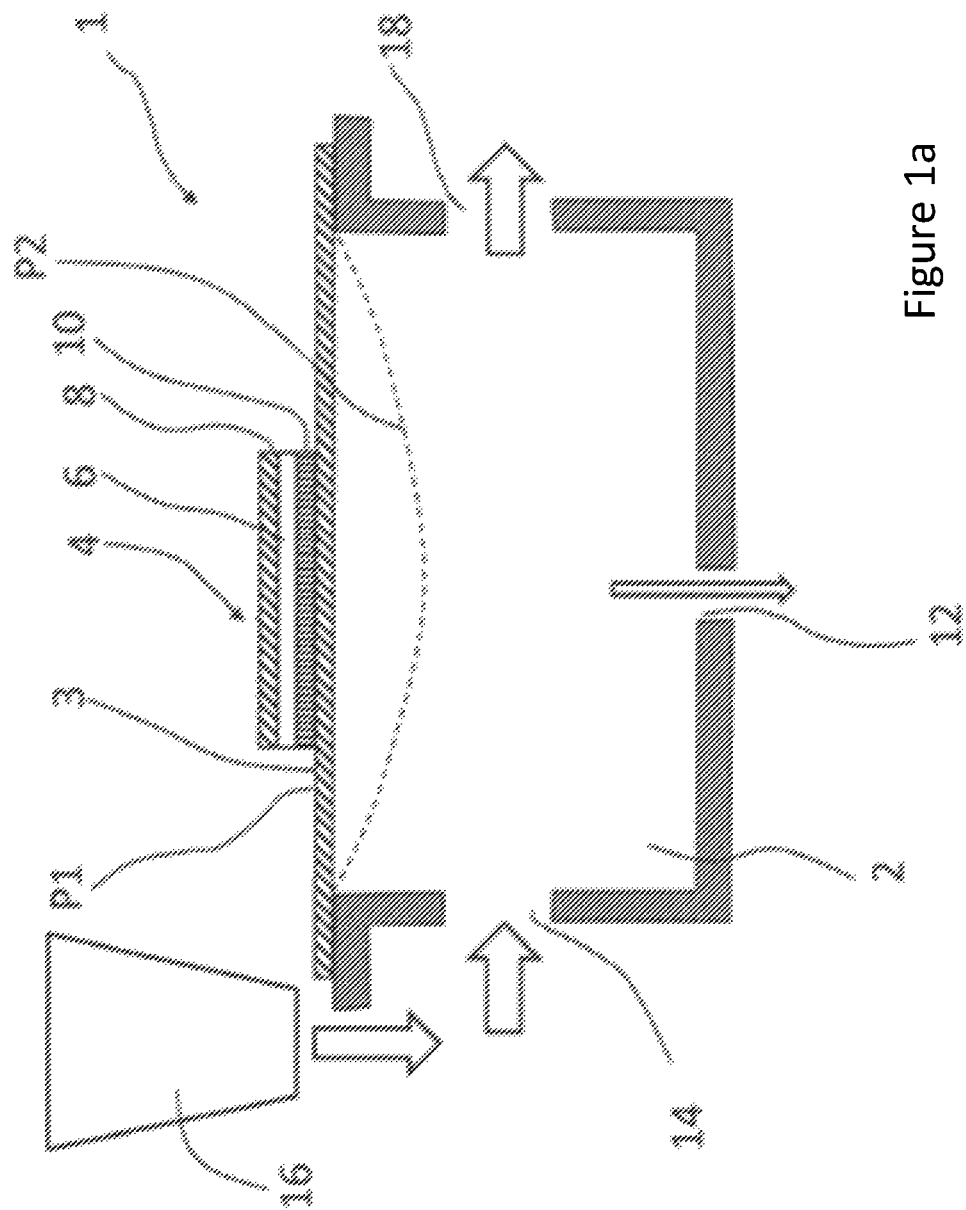

(52) U.S. Cl.
CPC ....... *B41J 2/04541* (2013.01); *B41J 2/04581* (2013.01); *G01R 27/2605* (2013.01); *G01R 31/2829* (2013.01)

(56) References Cited

U.S. PATENT DOCUMENTS

| | | | |
|---|---|---|---|
| 2007/0279446 | A1 | 12/2007 | Ishizaki |
| 2009/0244152 | A1 | 10/2009 | Ishizaki |
| 2011/0162181 | A1 | 7/2011 | Kim et al. |
| 2012/0007910 | A1* | 1/2012 | Lee ........................ B41J 2/0451 347/19 |

OTHER PUBLICATIONS

First Search report and Office Action dated Jun. 3, 2020, in Chinese Application No. 201780041171.0 (7 pgs.) and machine translation (7 pgs.).

* cited by examiner

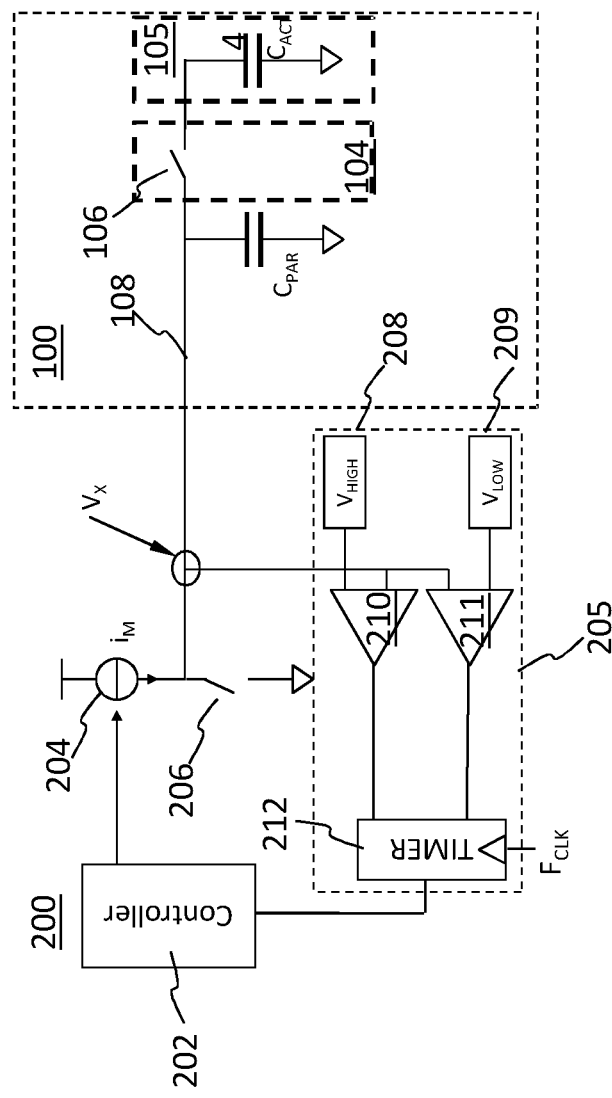
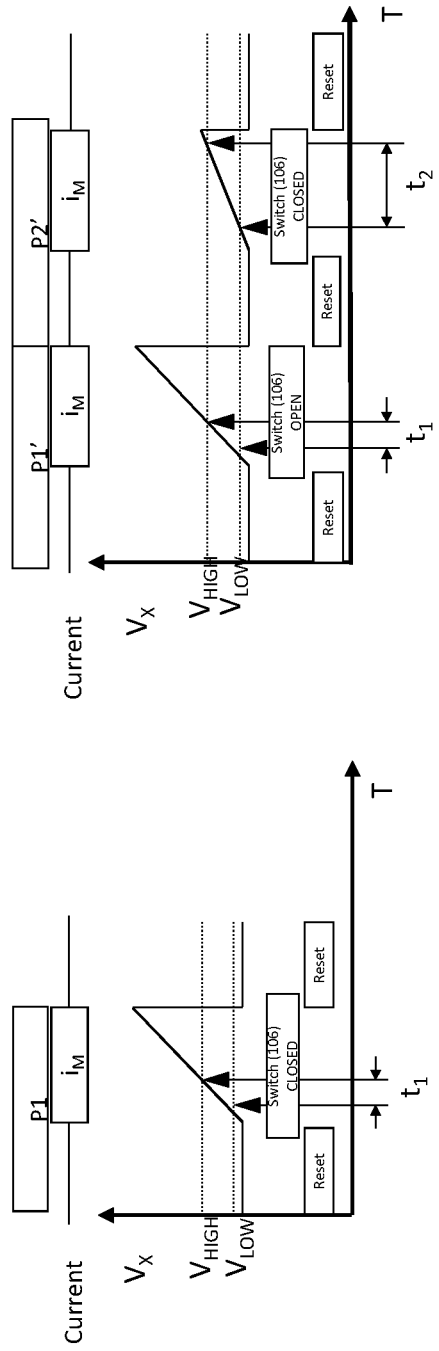

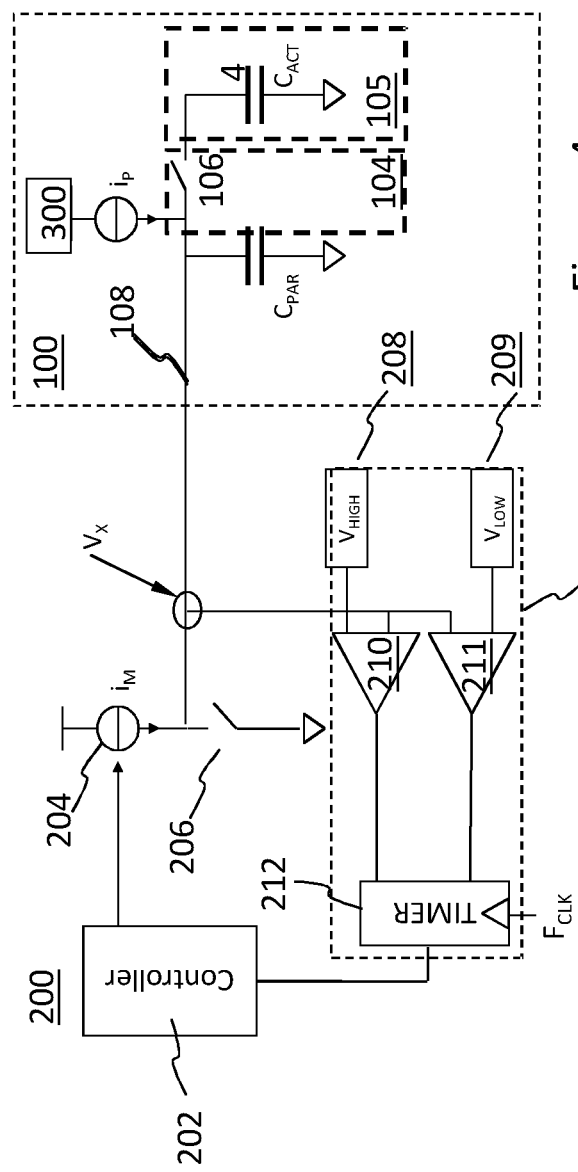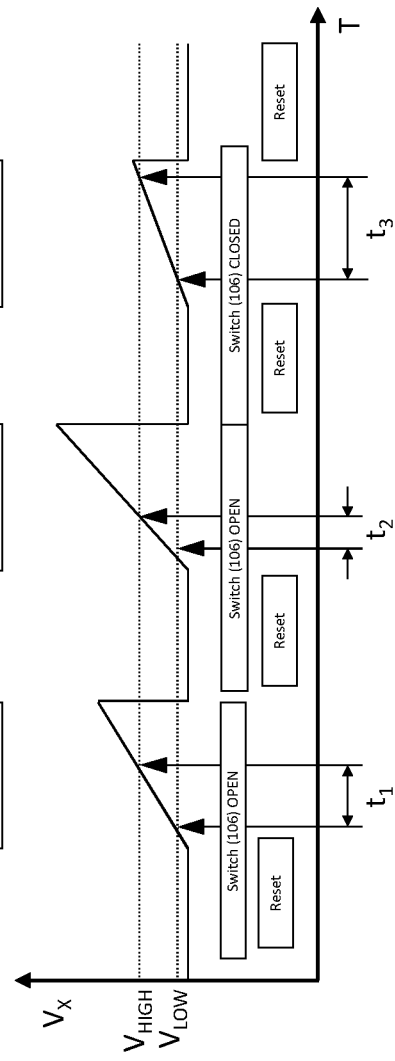

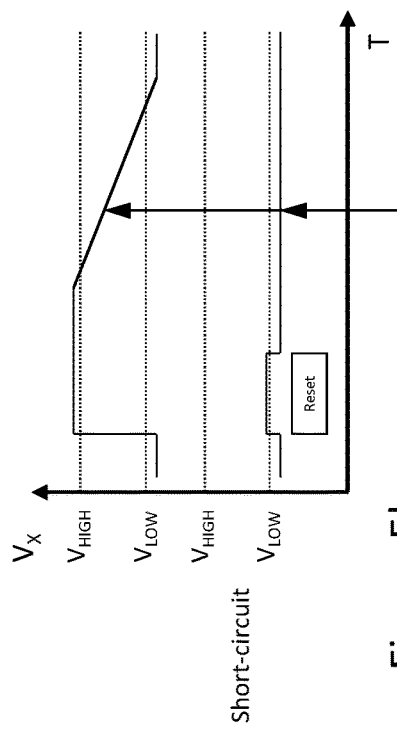
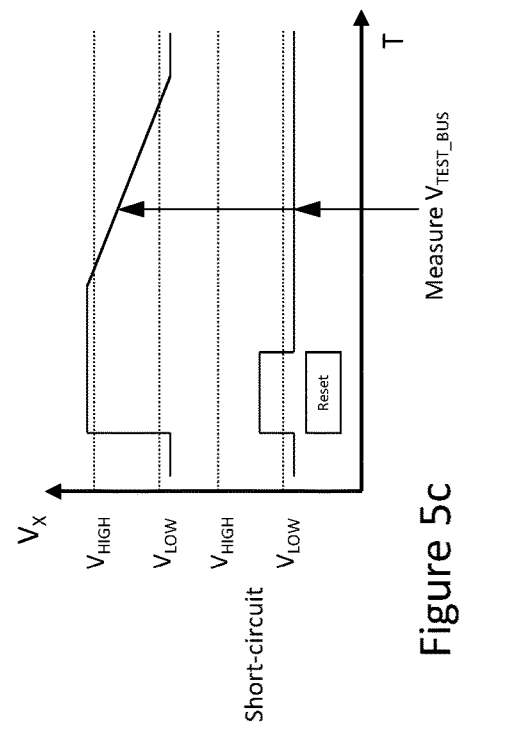
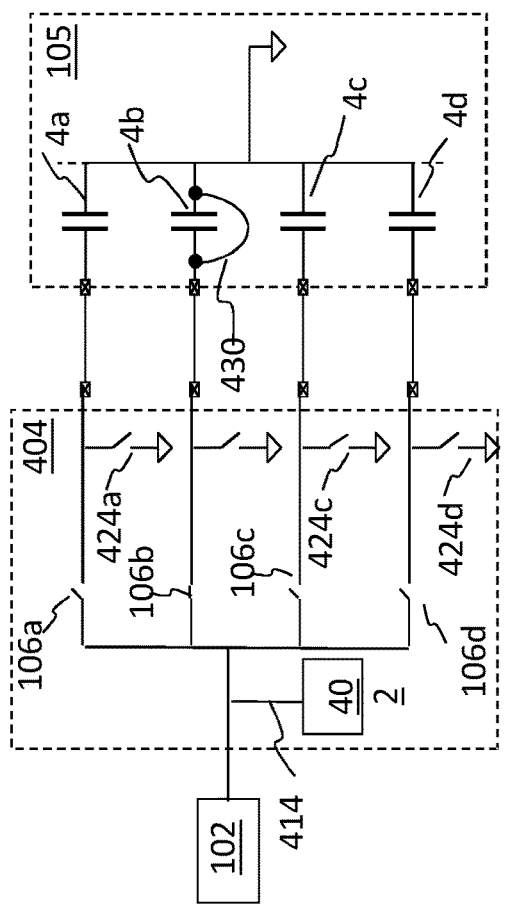
Figure 5b
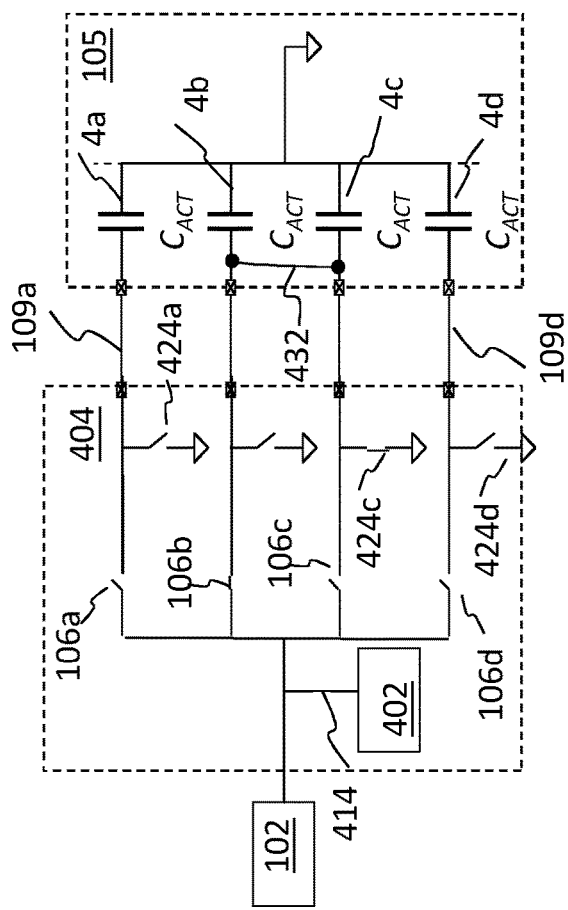
Figure 5c

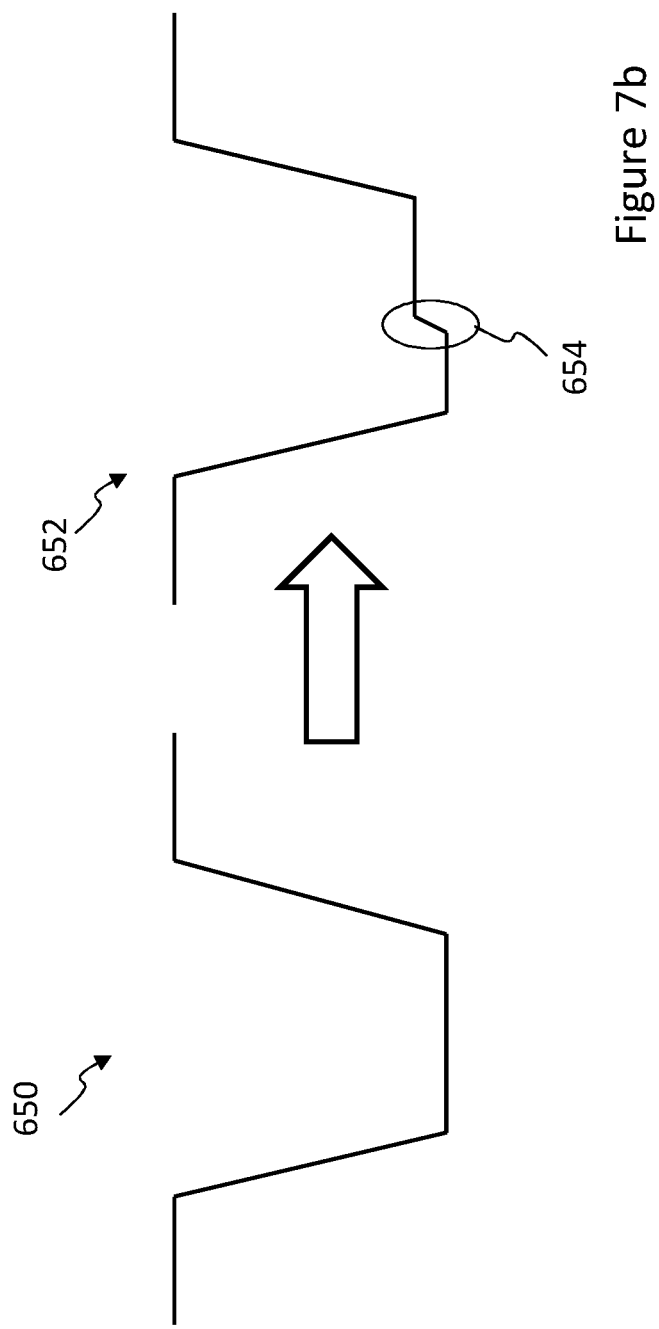

DROPLET DEPOSITION APPARATUS AND TEST CIRCUIT THEREFOR

This application is a National Stage Entry of International Application No. PCT/GB2017/051911, filed Jun. 29, 2017, which is based on and claims the benefit of foreign priority under 35 U.S.C. § 119 to GB Application No. 1611464.7, filed Jun. 30, 2016. The entire contents of the above-referenced applications are expressly incorporated herein by reference.

The present invention relates to a test circuit. It may find particularly beneficial application for an apparatus utilising piezoelectric elements such as in actuators in droplet deposition apparatuses, sensors or energy harvesters.

Droplet deposition apparatuses, such as inkjet printers, are known to provide controlled ejection of droplets from a droplet deposition head, and to provide for controlled placement of such droplets to create dots on a receiving or print medium.

Droplet deposition heads, such as inkjet printheads, generally comprise ejection mechanisms provided by actuator elements.

Performing diagnostic tests on the actuator elements and the associated drive circuitry is important, for example, to identify a fault in an actuator element(s) before being assembled into a printhead or after having being assembled into a printhead, to identify any faults which may generate unwanted print defects.

Faults which are tested for include open or short circuits across the actuator element which may be caused by, for example, thermal damage, handling damage or thermal shock, manufacturing or assembly defects.

Various diagnostic test techniques for testing actuator elements exist.

For example, when testing for short circuits across an actuator element, a current is drawn by the actuator element via a probe, and a corresponding voltage is measured or a voltage applied and a resulting current is measured. However, it is difficult to access the actuator elements with a probe when assembled into the printhead or printer. This becomes increasingly difficult or unviable with decreasing feature size of the printhead. Hence, open circuit testing is difficult using this method.

Alternatively, an optical technique may be used to test for open circuits across an actuator element, whereby the actuator element is driven with a waveform and the heat resulting from charging and discharging the actuator element is captured by an infrared (IR) camera. A heat spot verifies the presence or absence of an open circuit.

However, the equipment required for capturing the heat spot is complex and expensive, and in particular is not suitable once the actuator elements are assembled into the printhead as the hardware within the printhead typically obscures the line of sight of the IR camera.

Furthermore, as a short circuit also results in heat being generated from an actuator element when driven, the optical technique may be inaccurate when taken alone, and a further test(s) is required to be performed in conjunction with the optical technique to rule out a short circuit being present, and therefore, such testing may be slow.

Therefore, existing test techniques for testing actuator elements are slow, complex, expensive and/or inaccurate.

According to one aspect, there is provided a test circuit to determine the capacitance of an actuator element ($C_{ACT}$) in an actuator element array, wherein the test circuit comprises a controller; a source to generate test inputs; measurement circuitry to measure one or more test values on a test path between the test circuit and the actuator element; wherein the controller is configured to, for a test period: control a first switch associated with the actuator element to connect the actuator element to the test path; control the source to generate a first test input; determine a total capacitance of the actuator element ($C_{PAR}+C_{ACT}$) from a first test value generated in response to the first test input; and determine the capacitance of the actuator element ($C_{ACT}$) from the total capacitance ($C_{PAR}+C_{ACT}$).

Preferably, the controller is further configured to, for the first period: control a second switch associated with a further actuator element, to connect the further actuator element to the test path when a short circuit between the test path and the further actuator element is present.

Preferably, the controller is further configured to: detect a fault associated with the actuator element in response to one or more of: the test values and the determined capacitance, wherein the fault comprises one or more of: an open circuit, a short circuit across the actuator element and the short circuit between the test path and the further actuator element.

Preferably, the fault comprises: the determined capacitance being below a capacitance threshold.

Preferably, the controller is further configured to, for a first calibration period: control the first switch associated with the actuator element to isolate the actuator element from the test path; and control a second test input on the test path to charge a parasitic capacitance associated with the actuator element ($C_{PAR}$); determine the associated parasitic capacitance ($C_{PAR}$) from a second test value generated in response to the second test input; and wherein the associated parasitic capacitance for the actuator element ($C_{PAR}$) is used to determine the capacitance of the actuator element ($C_{ACT}$) from the total capacitance ($C_{PAR}+C_{ACT}$).

Preferably still, the first test value is further generated in response to the first test input and a parasitic current, wherein the controller is further configured to, for a first calibration period: control the source to bias the parasitic current away from the actuator element; control the first switch associated with the actuator element to electrically isolate the actuator element from the test path; control the source to charge a parasitic capacitance associated with the actuator element with the parasitic current; and generate a second test value in response to charging the associated parasitic capacitance with the parasitic current.

Preferably, the controller is further configured to, for a second calibration period: control the source to bias the parasitic current away from the actuator element; control the first switch associated with the actuator element to electrically isolate the actuator element from the test path; control the source to charge the associated parasitic capacitance with the parasitic current and a second test input; and generate a third test value in response to charging the associated parasitic capacitance with the parasitic current and second test input.

Preferably, the second test values and third test values are used to determine the capacitance of the actuator element ($C_{ACT}$) from the total capacitance ($C_{PAR}+C_{ACT}$).

Preferably, the measurement circuitry comprises one or more comparators each arranged to receive the one or more test values on the test path, wherein each of the comparators are arranged to receive a set level input and/or wherein the set level input comprises one of a voltage level and a current level.

Preferably, the measurement circuitry comprises a timer arranged to receive an output from the one or more comparators, wherein the timer is configured to measure one or more of: the transition time of the first test value from a first set level to a second set level, the transition time of the second test value from a third set level to a fourth set level and the transition time of the third test value from a fifth set level to a sixth set level.

Preferably, one or more of the first, third and fifth set levels are substantially equal and/or wherein, one or more of the second, fourth and sixth set levels are substantially equal.

Preferably, the test circuit further comprising a test switch arranged to electrically isolate the test circuit from the test path.

Preferably, the test circuit further comprises: a precision circuit to selectively provide the one or more test inputs to a further measurement circuit.

Preferably, the test circuit further comprises a discharge switch to discharge the test path.

Preferably, the source comprises a constant current source and wherein the first test input comprises a constant current.

According to a further aspect, there is provided a test circuit to detect a fault in an actuator element array, wherein the test circuit comprises: a controller; a source to generate test inputs; and measurement circuitry to measure one or more test values on a test path; wherein the controller is configured to, for a first period: control a first switch associated with a first actuator element of the array to connect the first actuator element to the test path; control the source to generate a first test input; and detect the fault from a first test value generated in response to the first test input.

Preferably, the controller is further configured to: control a second switch associated with a second actuator element in the array to discharge the second actuator element.

Preferably, the fault comprises a short circuit across the first actuator element and/or the fault comprises a short circuit between the test path and the second actuator element.

According to a further aspect, there is provided a droplet deposition head circuit comprising: an actuator element assembly comprising one or more actuator elements; a switch circuit comprising a plurality of switches for selectively connecting an actuator element of the one or more actuator elements to a test path or a drive path; and a test circuit configured to: determine a capacitance of the actuator element when connected to the test path and/or detect a fault in the actuator assembly.

Preferably, the test circuit comprises: a controller; a source to generate test inputs for the test path; and measurement circuitry to measure one or more test values on the test path generated in response to the test inputs.

Preferably, the test path comprises a discharge switch configured to discharge a capacitance on the test path.

Preferably, the test path comprises: a first test bus between the test circuit and the one or more actuator elements, wherein the drive path comprises the first test bus between a drive circuit and the one or more actuator elements.

Preferably, the drive path comprises a second test bus between a drive circuit and the one or more actuator elements Preferably, the test path comprises a test switch for electrically isolating the test circuit from the drive path.

Preferably, a switch of the plurality of switches comprises first and second switch elements arranged in series.

Preferably, the switch further comprises a third switch element arranged in parallel with the first and second switch elements, wherein the ON resistance of the first and second switch elements is lower than the ON resistance of the third switch element.

Preferably, the first test bus is coupled between the first and second switch elements, and wherein the first switch element is configured to electrically isolate the test circuit from the drive path.

Preferably, the switch further comprises a third switch element arranged in parallel with the first switch element, wherein the first test bus is coupled between the second and third switch elements, and wherein the test switch is provided on the test bus.

Preferably the droplet deposition head circuit further configured to initiate a fault action when the fault is detected.

Preferably, the fault comprises one of: an open circuit, a short circuit and a capacitance reaching a threshold.

According to a further aspect there is provided a method of determining a capacitance of an actuator element ($C_{ACT}$) in a printhead circuit, the method comprising: coupling the actuator element to a test path; generating, at a test circuit, a first input for the test path; measuring, at the test circuit, a first test value on the test path generated in response to the test input; determining, in response to the first test value a total capacitance of the actuator element ($C_{PAR}+C_{ACT}$) from the first test value; determining the capacitance of the actuator element ($C_{ACT}$) from the total capacitance ($C_{PAR}+C_{ACT}$).

Preferably, the method further comprising detecting a fault in response to the first test value and initiating a fault action on the printhead circuit when a fault is detected.

Figure 1B:
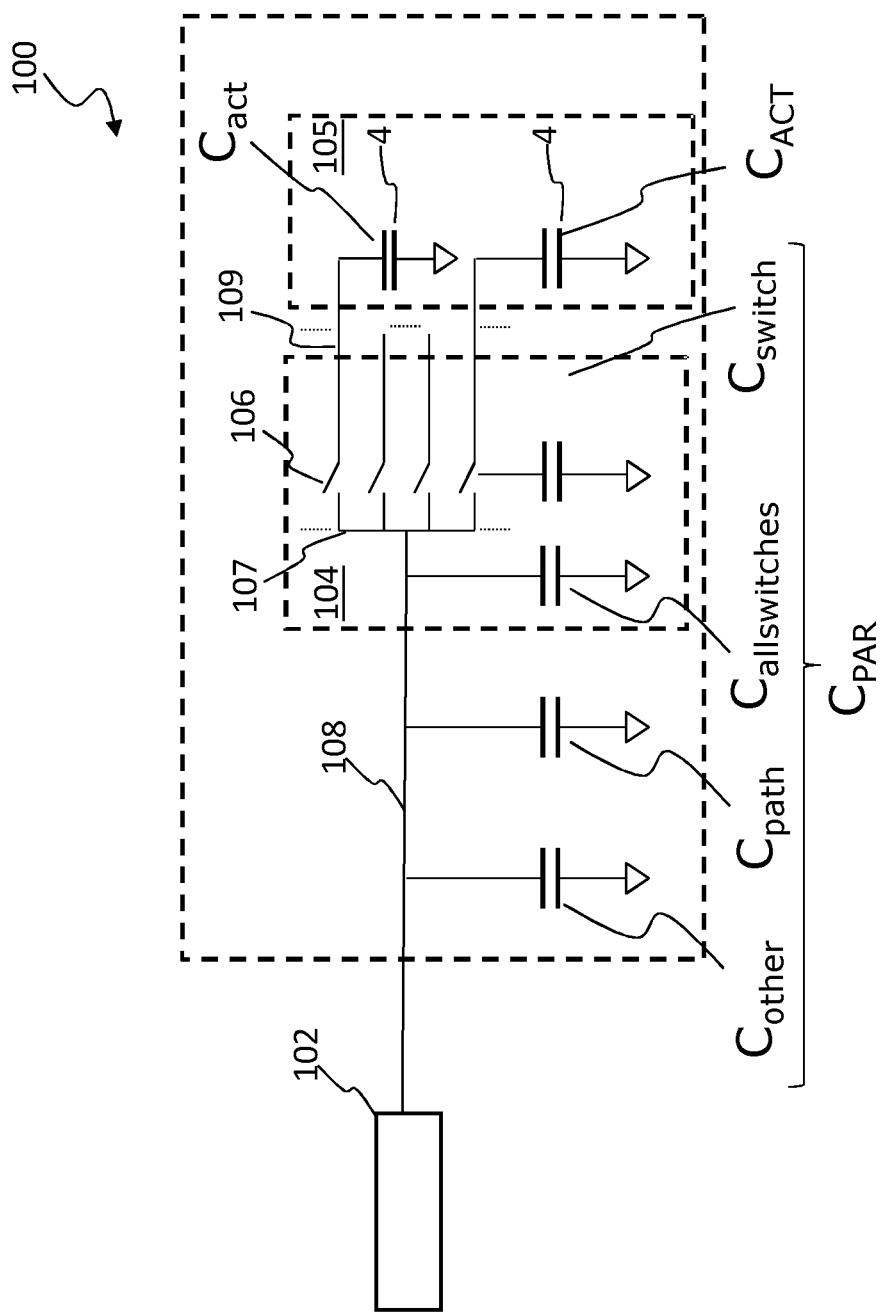
Figure 3A:
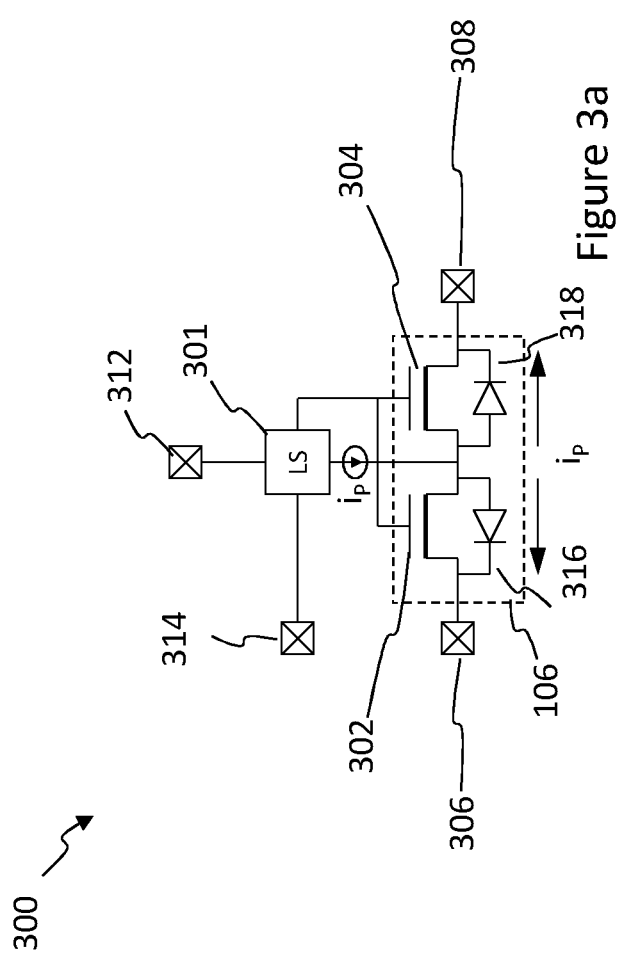
Figure 3B:
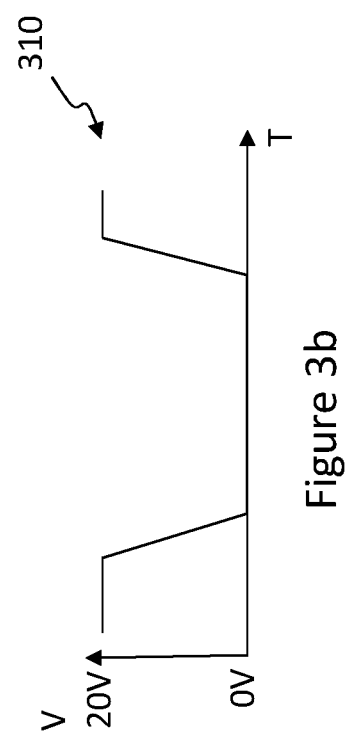
Figure 5A:
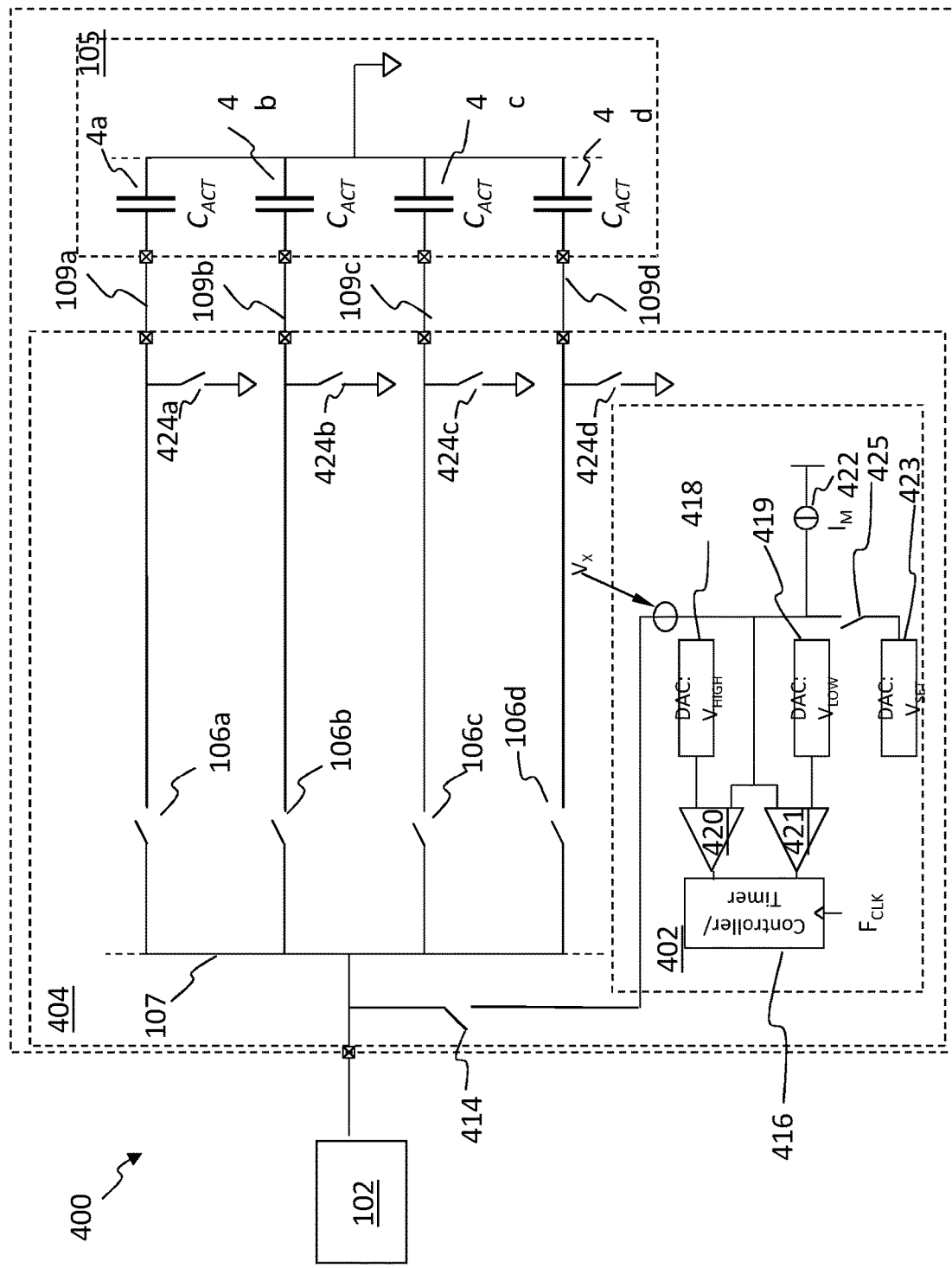
Figure 6:
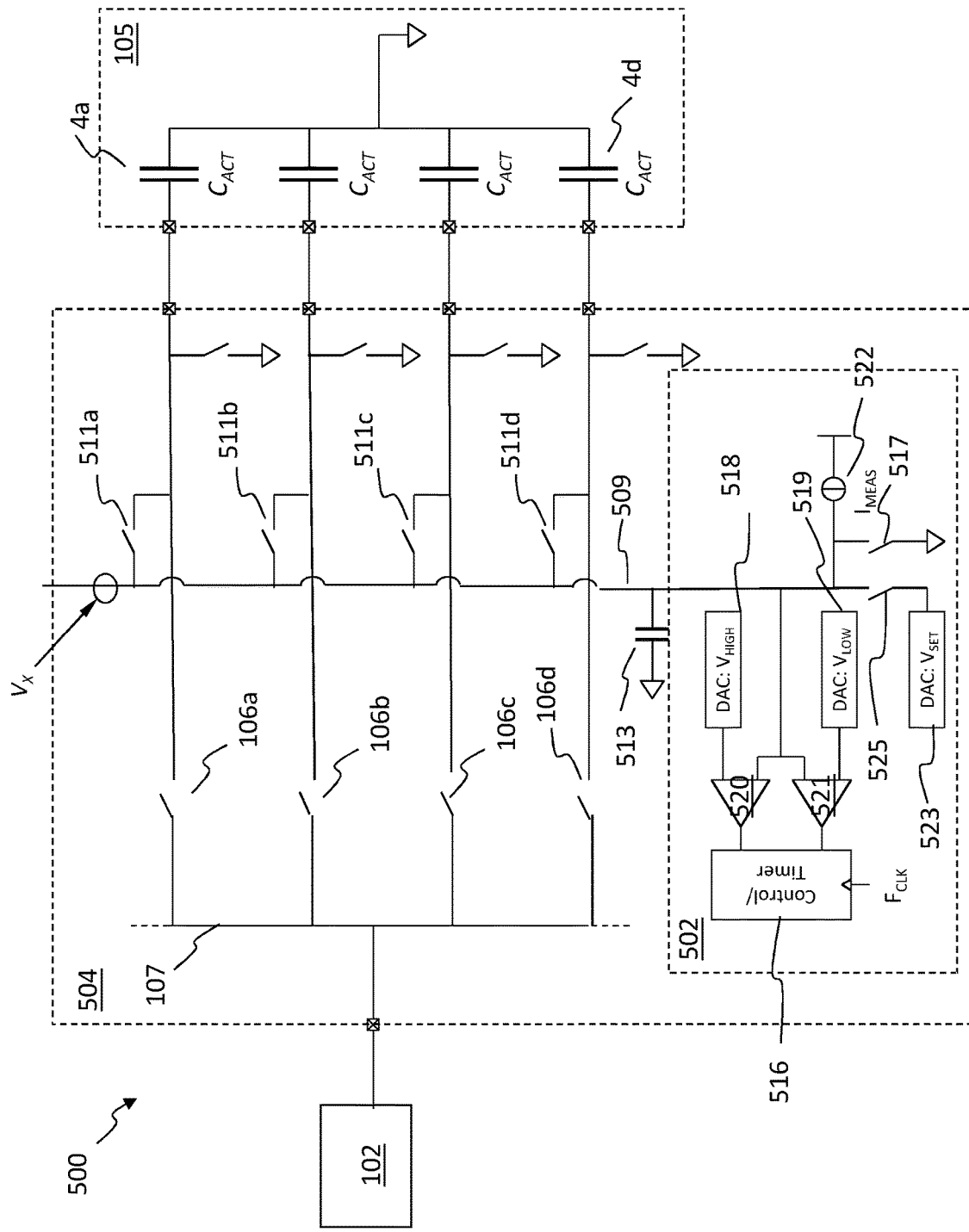
Figure 7A:
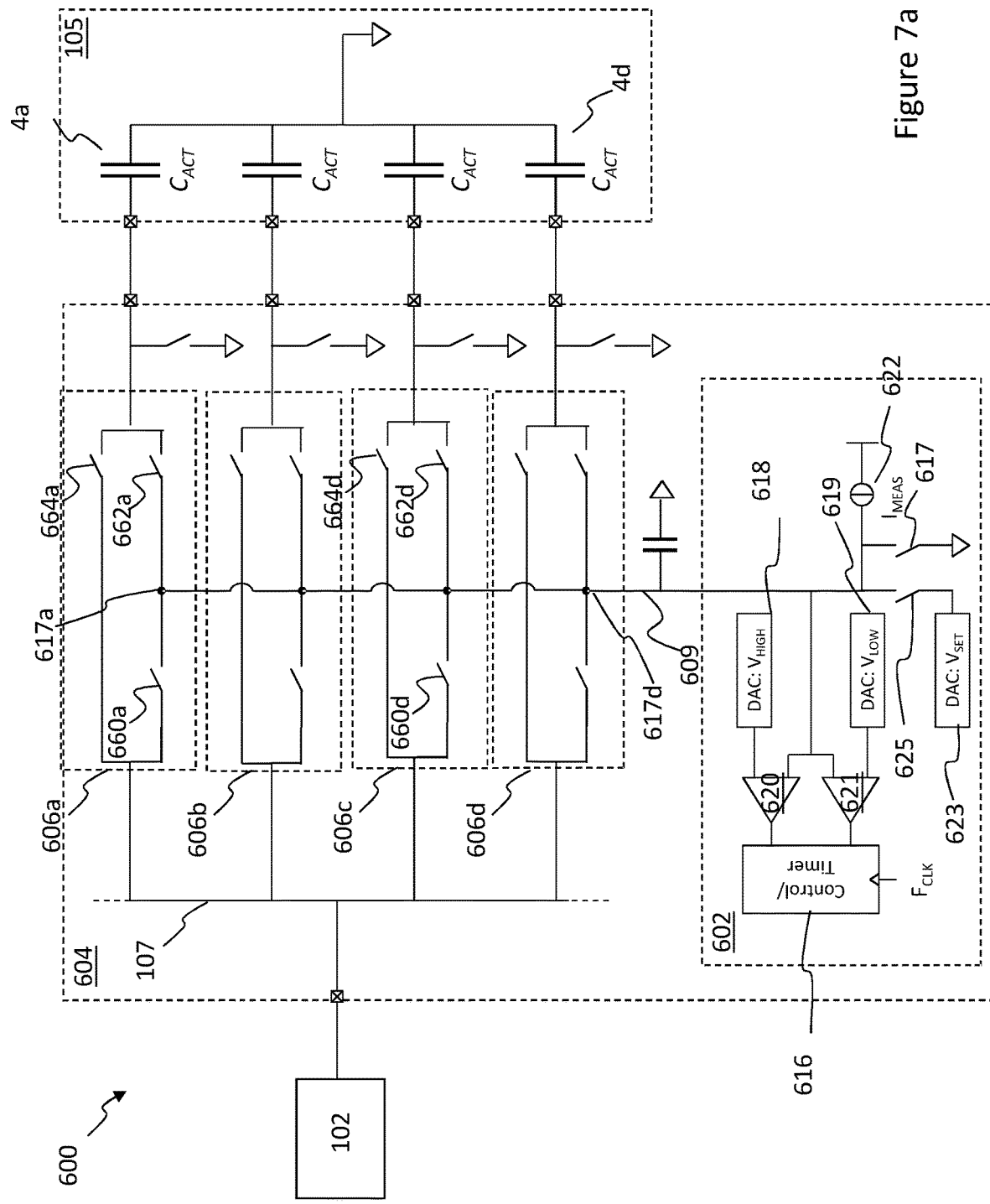
Figure 7C:
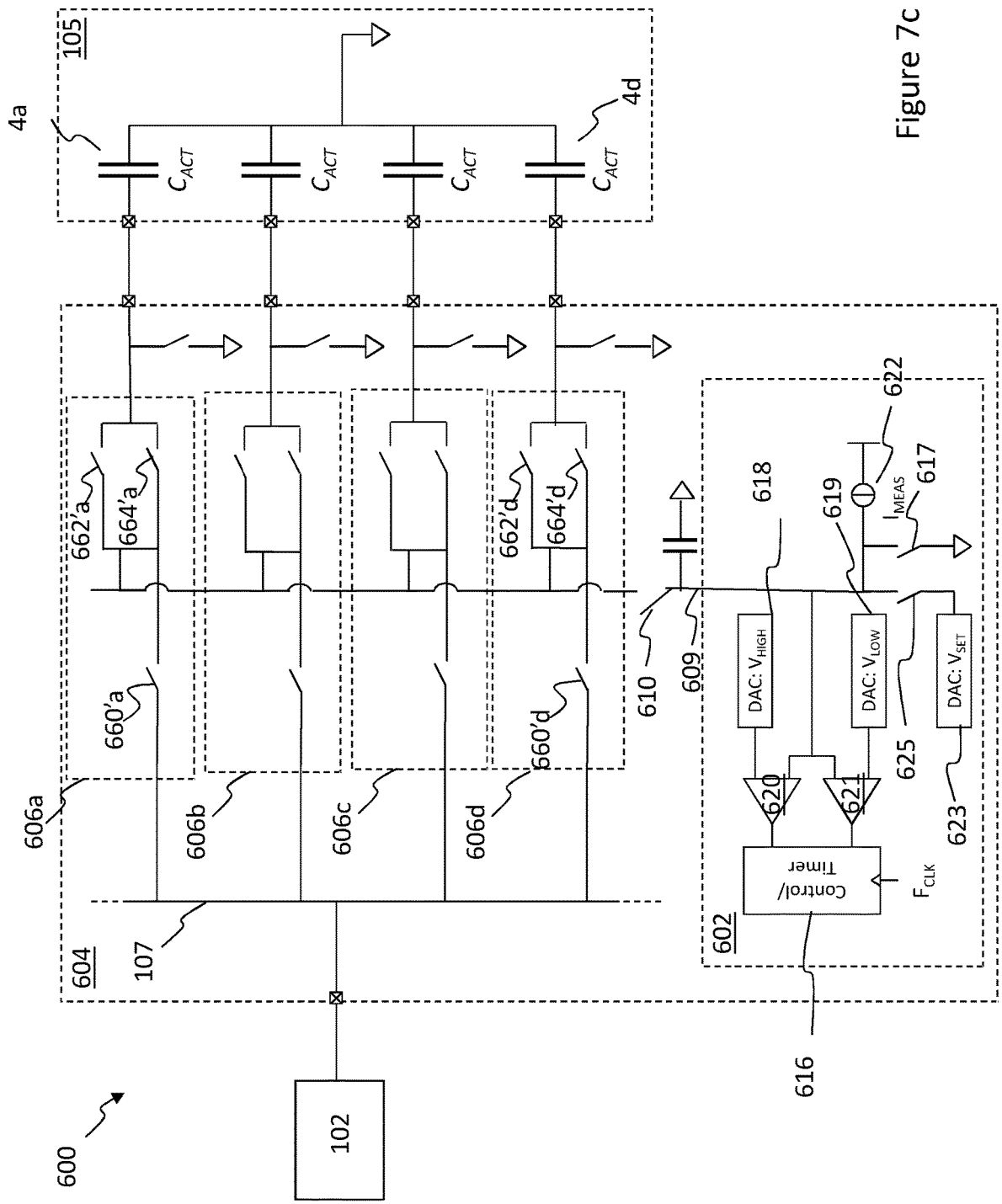
Figure 7D:
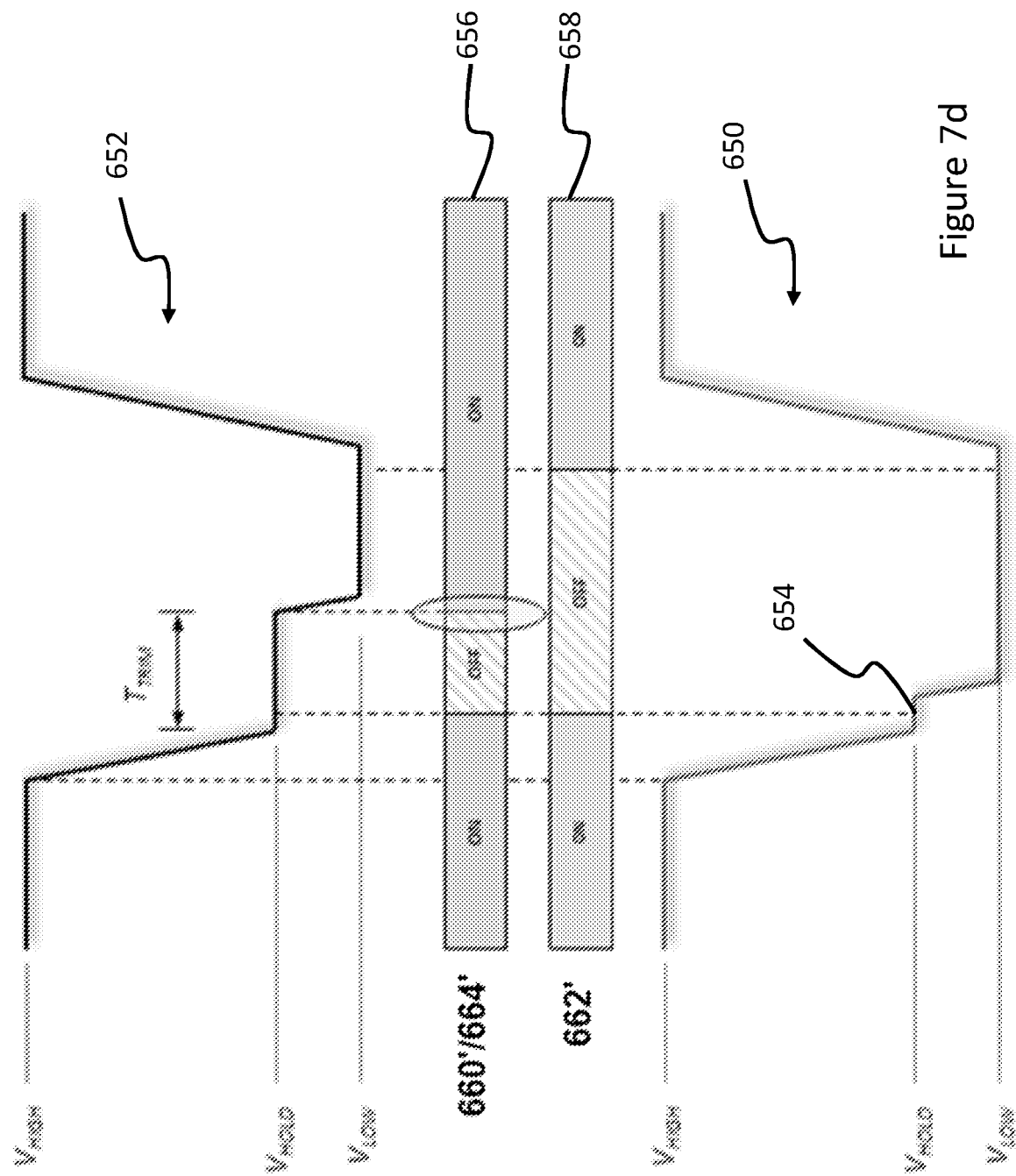

Embodiments will now be described with reference to the accompanying figures of which:

FIG. 1a schematically shows a cross section through part of a known droplet deposition head;

FIG. 1b schematically shows an example of a known circuit for driving a plurality of actuator elements of FIG. 1 according to an embodiment;

FIG. 2a schematically shows a test circuit for an actuator element according to an embodiment;

FIG. 2b graphically shows a measurement obtained using the test circuit of FIG. 2a;

FIG. 2c graphically shows a further measurement obtained using the test circuit of FIG. 2a;

FIG. 3a schematically shows an example switch according to an embodiment;

FIG. 3b schematically shows an example drive waveform according to an embodiment;

FIG. 4a schematically shows an example of the test circuit of FIG. 2a, wherein an actuator element is driven by the switch of FIG. 3a according to an embodiment;

FIG. 4b graphically shows a measurement obtained using the test circuit of FIG. 4a;

FIG. 5a schematically shows a circuit having a test circuit according to an embodiment;

FIG. 5b schematically shows a short circuit across an actuator element in the circuit of FIG. 5a;

FIG. 5c schematically shows a short circuit between actuator elements in the circuit of FIG. 5a;

FIG. 6 schematically shows a circuit having a test circuit according to an embodiment;

FIG. 7a schematically shows a circuit having a test circuit according to a further embodiment;

FIG. 7b schematically shows an example drive waveform according to an embodiment;

FIG. 7c schematically shows a circuit having a test circuit according to a further embodiment;

FIG. 7d schematically shows a further example drive waveform; and

Figure 8:
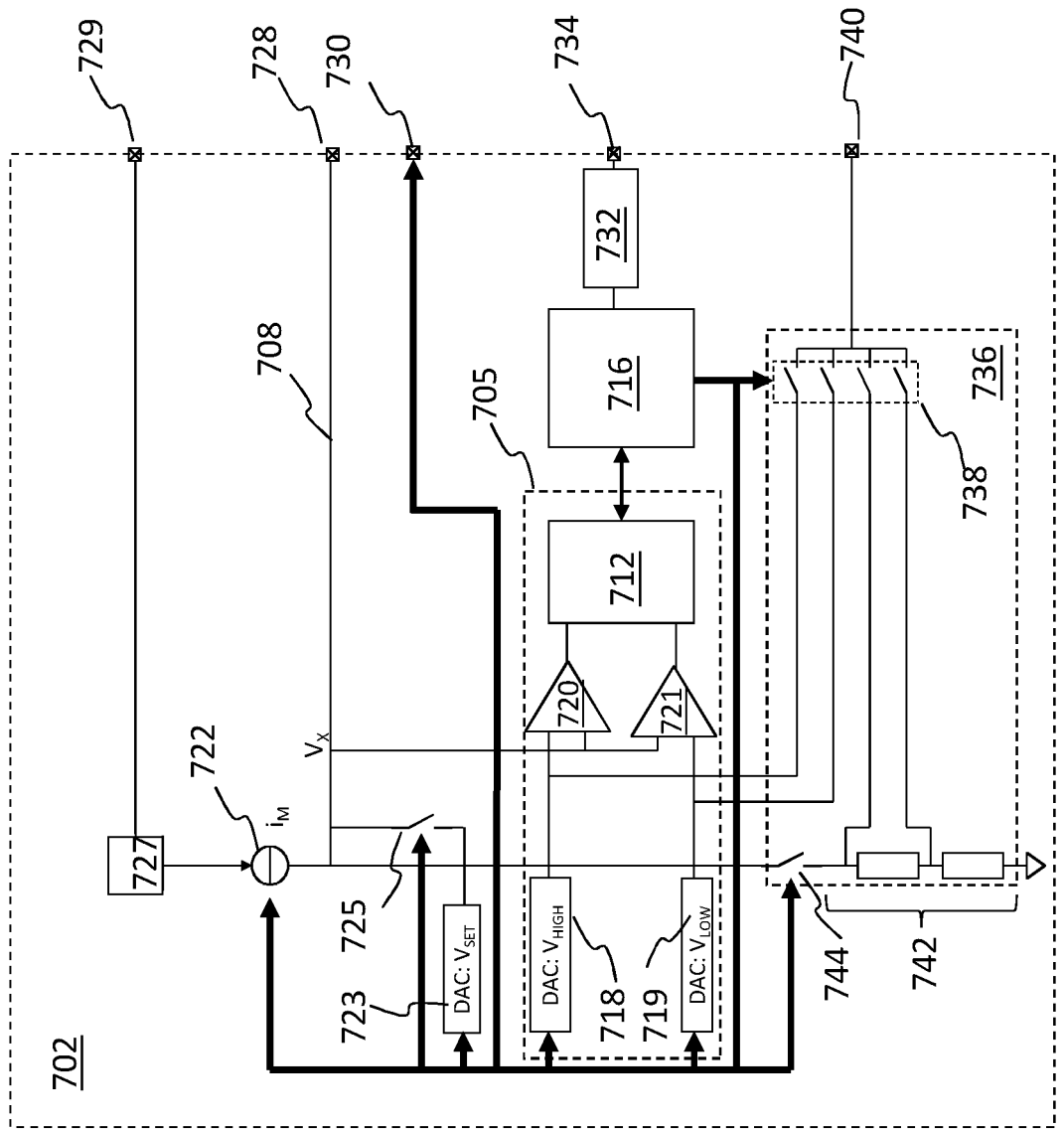

FIG. 8 schematically shows a test circuit implemented as a dedicated circuit.

FIG. 1a schematically shows a cross section through part of a known droplet deposition head, hereinafter "printhead". The printhead may be part of a known droplet deposition apparatus, hereinafter "printer".

In the present illustrative example, the printhead 1 comprises at least one pressure chamber 2, the pressure chamber 2 having a membrane 3 with an actuator element 4 provided thereon to effect movement of the membrane 3 between a first position (depicted as P1), here shown as a neutral position, inwards into the pressure chamber to a second position (depicted as P2). It will also be understood that the actuator element 4 could also be arranged to deflect the membrane in a direction from P1 opposite to that of P2 (i.e. outwards of the pressure chamber).

The pressure chamber 2 comprises a fluidic inlet port 14 for receiving fluid from a reservoir 16 arranged in fluidic communication with the pressure chamber 2.

The reservoir 16 is merely depicted adjacent the pressure chamber 2 for illustrative purposes. However, it may be provided further upstream, or remote from the printhead using a series of pumps/valves to regulate the flow of fluid therefrom/thereto as appropriate.

In the present examples, the actuator element 4 is depicted as a piezoelectric actuator element 4 whereby a piezoelectric material 6 is provided between a first electrode 8 and a second electrode 10 such that applying an electric field across the actuator element 4 causes the actuator element 4 to charge, whereby it experiences a strain and deforms. It will be understood that the actuator element is not limited to being a piezoelectric actuator element, and any suitable actuator element 4 demonstrating a capacitive response may be used as appropriate.

In the schematic example in FIG. 1, the pressure chamber 2 is arranged in what is commonly referred to as a "roof mode" configuration, whereby deflection of the membrane 3 changes the volume, and, therefore the pressure, within the pressure chamber 2. By applying a suitable deflection sequence to the membrane 3, sufficient positive pressure is generated within the pressure chamber 2 to eject one or more droplets therefrom.

Such droplet ejection from nozzle 12 may be achieved by applying one or more drive pulses in the form of a voltage waveform to associated actuator element 4, e.g. to the first electrode 8, whilst maintaining the bottom electrode 10 at a reference potential such as ground potential. By carefully designing the drive waveform, it is possible to achieve predictable and uniform droplet ejection from the nozzle 12.

In embodiments the printhead 1 may comprise a plurality of actuator elements and associated nozzles arranged in one or more arrays thereon.

In embodiments, a common drive waveform comprising a sequence of one or more drive pulses may be generated by a drive circuit and selectively applied to a plurality of actuator elements as a drive waveform for ejecting droplets from nozzles associated therewith.

Alternatively, a drive waveform comprising a sequence of one or more drive pulses may be generated on a per actuator element basis. Such a drive waveform may be generated, for example, by drive circuitry on, or in communication with, the printhead.

As will be understood by a person skilled in the art the ejection of the droplets may be timed so as to accurately land on a receiving medium (in conjunction with regulating the motion of a receiving medium, where necessary) within predetermined areas defined as pixels.

These pixels are based on a rasterization of the image that is to be printed as derived from the print data, and are used to determine a desired position of the resulting dot on the receiving medium.

In a simple binary representation, each pixel will be filled with either one or no droplet.

In a more complex representation, greyscale levels may be added by printing two or more droplets into each pixel to alter the perceived colour density of the resulting pixel.

Whilst only one pressure chamber 2 is depicted in FIG. 1a, it will be understood that any number of pressure chambers may be arranged in a suitable configuration(s) in printhead 1.

The printhead 1 and the associated features thereof (e.g. nozzle(s), actuator element(s), membrane(s), fluid port(s) etc.) may be fabricated using any suitable fabrication processes or techniques, such as micro-electrical-mechanical systems (MEMS) or bulk manufacturing processes.

It will be understood that the techniques described herein are not limited to printheads operating in roof mode configurations, and equally apply to printheads having other configurations, such as shared wall configurations.

FIG. 1b schematically shows an example of a printhead circuit 100 comprising actuator element array 105 having a plurality of actuator elements 4 as previously described.

The printhead circuit 100 is provided in electrical communication with a drive circuit 102, whereby the drive circuit 102 generates a drive waveform e.g. using an amplifier (not shown).

The drive circuit 102 is arranged in electrical communication with a switch circuit 104, whereby the switch circuit 104 comprises a plurality of switches 106 for selectively applying the drive waveform to the plurality of actuator elements 4 of the actuator element array 105.

In the present example, the switches 106 are connected to the drive circuit 102 via an electrical track 108, and bus 107 which is common to all switches 106. In alternative examples, the switches 106 may each be connected to the drive circuit 102 via individual electrical tracks. Each switch 106 is connected to an associated actuator element 4 via individual actuator track 109 therebetween.

The switch circuit 104 may be an integrated circuit, and may comprise, for example, an application specific integrated circuit (ASIC). The switch circuit 104 is functionally similar to a multiplexer in that a particular switch may be controlled to be, for example, turned on (e.g. closed) to provide a corresponding actuator element in electrical communication with the drive circuit, whereby a drive waveform may be applied to the actuator element 4; or the particular switch may be controlled to be, for example, turned off (e.g. opened) to electrically isolate the actuator element from the drive circuit 102. For simplicity, the electrical path between the drive circuit and an actuator element 4 will be referred to as a "drive path."

In the present illustrative example, the actuator elements 4 are piezoelectric actuator elements and so, the electrical behaviour of each actuator element 4 is similar to a capacitor, whereby each actuator element 4 has an associated capacitance $C_{ACT}$. It will be understood that $C_{ACT}$ may also include capacitance of circuitry (e.g. components/logic/functions) associated with the actuator element 4, such as the capacitance of its actuator track 109 or the capacitance of a physical connection to connect the actuator element to the actuator track 109.

Different circuitry/components of the printhead circuit 100 will also have associated capacitances. For the purposes of the present application, the capacitances other than those associated with the actuator elements $C_{ACT}$ are taken to be "parasitic capacitances".

In FIG. 1b all parasitic capacitances in the printhead circuit 100 are depicted as $C_{PAR}$ and include: the parasitic capacitance ($C_{path}$) of the electrical track 108; the combined parasitic capacitance ($C_{allswitches}$) of all switches 106, the parasitic capacitance ($C_{switch}$) of individual switches 106; and other parasitic capacitances ($C_{other}$) such as those associated with, for example, the drive circuit 102 and connections between components in the printhead circuit 100. Such components may include physical bonds between the drive circuit 102 and electrical track 108, or between the switch circuit 104 and electrical track 108. Such bonds may include anisotropic conductive film bonds.

As detailed above, it is useful to undertake one or more diagnostic tests e.g. to determine a capacitance of an actuator element and/or to detect an open circuit or short circuit in the actuator element array 105 post manufacture and pre and post assembly into a printhead. In some examples, a determined capacitance may be indicative of an open circuit or short circuit. For example, a determined capacitance below a predefined threshold capacitance may be indicative of an open circuit.

However, such tests are difficult to undertake e.g. due to the positioning of the actuator element array in the printhead or such tests may be inaccurate due to, for example the parasitic capacitances affecting test results.

FIG. 2a schematically shows an example of a test circuit 200 for undertaking diagnostic tests on an actuator element 4 of printhead circuit 100 according to an embodiment. Like numbering will be used to describe like features throughout.

The test circuit 200 is arranged in electrical communication with one or more actuator elements 4 via electrical track 108 and corresponding switch 106 of switch logic 104 (only one actuator element 4 is depicted in FIG. 2a).

For simplicity, the electrical path between the test circuit 200 and the actuator array 105 is taken to be a "test path," whereby the switches 106 can be controlled to electrically connect or isolate the one or more actuator elements to the test path as appropriate.

In FIG. 2a the test circuit 200 is depicted as being in electrical communication with the printhead circuit 100, e.g. via an interface on the printer or printhead. In other examples, the test circuit 200 may be integrated as part of the printhead circuit 100.

The test circuit 200 comprises controller 202, source 204 and measurement circuit 205.

The controller 202 may comprise, for example, a field programmable gate array (FPGA), microcontroller or other suitable circuitry (e.g. components, logic, functions).

The controller 202 interfaces with various circuitry and components within the test circuit 200 such as the printhead circuit 100, drive circuit (not shown in FIG. 2a) and/or other circuitry on the printer (not shown). For example, controller 202 controls the switches 106, whereby one or more actuator elements 4 may be connected to the test circuit 200 for diagnostic testing at any one time.

In the following illustrative examples, source 204 is a current source for generating constant current ($i_M$), the level of which is defined by the controller 202. As will become clear, the current source 204 preferably has a high output impedance for linear charging of the actuator elements to improve the accuracy of the capacitance measurement.

Measurement circuit 205 is arranged to sense or measure and process one or more values on a test path during diagnostic testing.

In the present illustrative example, the measurement circuit 205 comprises sources 208, 209, and comparators 210, 211, and timer 212.

A reset switch 206 is provided to discharge the test path and may be any suitable switch element (e.g. an NMOS transistor), which connects the test path to a reference voltage (e.g. ground). Reset switch 206 is controllable by the controller 202.

Sources 208, 209, which, in the following examples, are depicted as digital-to-analog converters (DACs), each generate a defined voltage level (depicted as $V_{HIGH}$ from DAC 208, and $V_{LOW}$ from DAC 209). The voltage levels generated by DACs 208, 209 may be defined in response to a signal (not shown) from the controller 202.

Comparators 210, 211 each use one of the voltage levels defined by the DACs 208, 209 as a first input and voltage $V_X$ from the test path as a second input. In FIG. 2a, a first input to comparator 210 is $V_{HIGH}$ from DAC 208, whilst a first input to comparator 211 is $V_{LOW}$ from DAC 209.

The timer 212 receives the output of the comparators 210, 211, and times the transition of $V_X$ from $V_{LOW}$ to $V_{HIGH}$. The timer 212 operates at a clock frequency $F_{CLK}$, generated by any suitable source to operate at any suitable frequency (e.g. ~10 MHz). It will be appreciated that the accuracy of the measurements therefrom may be improved by increasing the clock frequency. The timer 212 may be implemented in an FPGA or the microcontroller, or may be implemented as a dedicated integrated circuit (IC). In alternative examples the timer 212 may be integrated within the controller 202.

The test circuit 200 may be used to determine the capacitance $C_{ACT}$ of an actuator element 4 whereby FIG. 2b graphically shows a measurement obtained using the test circuit 200 in determining $C_{ACT}$ according to an embodiment.

As an illustrative example, for a first test period $P_1$, the controller 202, having reset the capacitance in the test path by closing reset switch 206 to discharge the parasitic capacitances $C_{PAR}$ (and in some examples the capacitance $C_{ACT}$), closes switch 106 and opens reset switch 206 such that a test input comprising current $i_M$ charges the combined capacitances $C_{PAR}+C_{ACT}$, whereby, as depicted in FIG. 2b, the voltage $V_X$ rises over time (T) at a rate given by equation (1):

$$\left|\frac{dV}{dt}\right|_1 = \frac{(i_M)}{(C_{PAR} + C_{ACT})} \quad (1)$$

$V_X$ is an input to comparators 210, 211 and as $V_X$ rises, the timer 212 measures the transition time ($t_1$) between the switching of the $V_{LOW}$ comparator 211 (i.e. $V_X$ passing $V_{LOW}$) and the switching of the $V_{HIGH}$ comparator 210 (i.e. $V_X$ passing $V_{HIGH}$).

The measured transition time ($t_1$) is obtained from equations (2) and (3):

$$\left|\frac{dV}{dt}\right|_1 = \frac{(V_{HIGH} - V_{LOW})}{t_1} \quad (2)$$

$$t_1 = \frac{(C_{(PAR)} + C_{(ACT)})(V_{HIGH} - V_{LOW})}{i_M} \quad (3)$$

Therefore, total capacitance is determined from (4):

$$(C_{(PAR)} + C_{(ACT)}) = \frac{i_M t_1}{(V_{HIGH} - V_{LOW})} \quad (4)$$

Hence, $C_{ACT}$ may be calculated from (5):

$$C_{ACT} = \frac{i_M t_1}{(V_{HIGH} - V_{LOW})} - C_{PAR} \quad (5)$$

However, as $C_{PAR}$ is unknown, $(C_{(PAR)} + C_{(ACT)})$ does not provide for an accurate determination of $C_{ACT}$, and $C_{ACT}$ therefore may not conclusively indicate the presence or absence of an open circuit.

Whilst an estimated value may be taken for parasitic capacitances $C_{PAR}$, batch to batch variances for all circuitry may affect both the parasitic and actuator capacitances, and therefore may increase the difficulty for accurately estimating the parasitic capacitances.

Therefore, in order to more accurately determine $C_{ACT}$, the test circuit performs two measurements over two periods $P_1'$ and $P_2'$, whereby FIG. 2c graphically shows measurements obtained using the test circuit 200 in determining $C_{ACT}$ according to a further embodiment.

For the first period $P_1'$, which may be taken to be a calibration period, the controller 202, having reset the capacitances in the test path, opens switch 106 and opens reset switch 206 such that test input current $i_M$ charges the parasitic capacitance $C_{PAR}$ during $P_1'$, whereby, as depicted in FIG. 2c, the voltage $V_X$ rises over time at a rate given by (6):

$$\left|\frac{dV}{dt}\right|_1 = \frac{(i_M)}{(C_{PAR})}. \quad (6)$$

As $V_X$ rises, the timer 212 measures the transition time ($t_1$) between the switching of the $V_{LOW}$ comparator 211 and the switching of the $V_{HIGH}$ comparator 210.

The measured transition time ($t_1$) is obtained from (7):

$$t_1 = \frac{(C_{PAR})(V_{HIGH} - V_{LOW})}{i_M} \quad (7)$$

Therefore, parasitic capacitance is determined from (8):

$$C_{PAR} = \frac{i_M t_1}{(V_{HIGH} - V_{LOW})} \quad (8)$$

For a second period $P_2'$, which may be taken to be a test period, the controller 202 closes reset switch 206 to reset the capacitance in the test path, and then closes switch 106 and opens reset switch 206 such that test input current $i_M$ charges the combined capacitances $C_{PAR} + C_{ACT}$, whereby, as depicted in FIG. 2c, the voltage $V_X$ rises over time at a rate given by (9):

$$\left|\frac{dV}{dt}\right|_2 = \frac{(i_M)}{(C_{PAR} + C_{ACT})} \quad (9)$$

As $V_X$ rises, the timer 212 measures the transition time $t_2$ between the switching of the $V_{LOW}$ comparator 211 and the switching of the $V_{HIGH}$ comparator 210 is given by (10a).

$$t_2 = \frac{(C_{PAR} + C_{ACT})(V_{HIGH} - V_{LOW})}{i_M} \quad (10a)$$

Therefore, total capacitance can be determined from 10b, whereby $$(C_{PAR} + C_{ACT}) = \frac{i_M t_2}{(V_{HIGH} - V_{LOW})} \quad (10b)$$

and substituting for $C_{PAR}$ from (8) it is possible to determine $C_{ACT}$:

$$C_{(ACT)} = \frac{i_M}{(V_{HIGH} - V_{LOW})} \cdot (t_2 - t_1) \quad (11)$$

Therefore, when using a calibration period to first determine $C_{PAR}$ it is possible to more accurately determine $C_{ACT}$ in comparison to estimating $C_{PAR}$. It is also possible, therefore, to more accurately detect the presence or absence of an open circuit based on, or in response to, $C_{ACT}$.

FIG. 3a schematically shows an example of a switch 106, and switch control circuitry 300 according to an embodiment, and FIG. 3b shows an example of a drive waveform 310 used to drive one or more of actuator elements.

In the present illustrative example, the switch 106 comprises two switch elements, depicted as transistors 302, 304 arranged in series e.g. in a passgate configuration. Such an arrangement provides for high voltage and high current operations whilst printing. Whilst the switch elements of switch 106 are depicted as transistors, the switch elements are not limited to being transistors, nor is the number of switch elements limited to being two.

It is advantageous to minimise the ON resistance of the switch 106 so as to minimise the power dissipation in the printhead circuit (e.g. by reducing the conductor ($I^2R$) losses), and to optimise the shape (e.g. the edges and slew rates) of the drive waveform 310 so as to obtain a desired droplet velocity and droplet volume.

In the present illustrative example, the transistors 302, 304 share a common source. The drain of transistor 302 is arranged in electrical communication with the drive circuit/test circuit (not shown) via terminal 306, and the drain of transistor 304 is arranged in electrical communication with an actuator element (not shown) via terminal 308. Each transistor 302, 304 also has a respective diode 316, 318 arranged between its source and drain such that current flows from the source to the drain (as indicated by arrows). The diodes 316, 318 may each be an intrinsic diode in the transistors 302, 304.

To turn the switch 106 on (i.e. to close the switch), a potential difference of approximately 5V is applied between the source and gate of each transistor 302, 304.

As drive waveforms transition between different voltages, such as the drive waveform 310 depicted in FIG. 3b which transitions between 0V and 20V, the voltage at the common source is required to respond to the different voltages in order for the transistors 302, 304 to remain on when required.

Such control is provided by the switch control circuitry 300 which comprises a level shifter 301 configured to generate a variable voltage that stands atop the common source voltage to provide the necessary potential difference as the drive waveform 310 transitions between the different voltages.

The level shifter 301 is powered via terminal 312, whilst the variable voltage may be generated in response to level signals received via terminal 314 e.g. from a drive circuit.

A parasitic current $i_p$ is generated by the level shifter 301, whereby $i_p$ flows through the common source when the switch 106 is closed and also flows through the common source when the switch 106 is opened.

It will be understood by a person skilled in the art that in other embodiments a parasitic current $i_p$ may be generated by components/circuitry other than the level shifter.

When the switch 106 is opened, $i_p$ may flow to terminal 306, via diode 316, where it will be sunk (e.g. by an amplifier in a drive circuit). Additionally, or alternatively, the current $i_p$ may flow to terminal 308 via diode 318, whereby it will charge the actuator element in electrical communication therewith. Therefore, $i_p$ will be seen to be a parasitic current when the switch 106 is opened.

In order to control the direction in which $i_p$ flows when the switch 106 is off, the voltages at either side of the switch 106 (e.g. at terminals 306, 308) may be set by the test circuit 200, for example by using a further DAC (not shown in FIG. 3), to bias the terminals 306, 308 (or circuitry in communication therewith such as the actuator elements). Therefore, the test circuit 200 can bias the terminals 306, 308 to ensure that $i_p$ does not flow through diode 318 when the switch 106 is opened.

FIG. 4a schematically shows an example of a test circuit 200 for performing diagnostic tests on an actuator element 4 of a printhead circuit 100 according to an embodiment, whereby the actuator element 4 is connected to a switch 106 having associated switch control circuity 300, whereby a parasitic current $i_p$ charges the actuator element 4 as previously described.

FIG. 4b graphically shows measurements obtained using the test circuit 200 of FIG. 4a in determining $C_{ACT}$ according to a further embodiment.

As above, it may be useful to determine the capacitance $C_{ACT}$ of the actuator element 4. However, there are multiple unknowns in the circuit depicted in FIG. 4a. For example, the actuator capacitance ($C_{ACT}$), the parasitic capacitance ($C_{PAR}$) and the parasitic current ($i_p$) are unknown.

Therefore, to more accurately determine $C_{ACT}$, the test circuit 202 performs three measurements over three time periods $P_1''$, $P_2''$ & $P_3''$.

For the first period $P_1''$, which may be taken to be a first calibration period, the controller opens reset switch 206, closes switch 106 and controls current source 204 to generate $i_M$ to bias the terminals of the switch 106 and/or the actuator element 4 to control the direction of $i_p$ such that a test input comprising $i_p$ will charge the parasitic capacitance $C_{PAR}$.

When the actuator element 4 is biased, the controller 202 opens switch 106 to electrically isolate the actuator element 4 from the test path, and closes reset switch 206 and controls current source 204 to prevent $i_M$ from flowing, such that $C_{PAR}$ in the test path discharges.

The controller 202 opens reset switch 206, opens 106 and controls current source 204 to prevent $i_M$ from flowing.

As depicted in FIG. 4b, the voltage $V_X$ rises over time during $P_1''$ in response to $i_p$ at a slew rate $SR_1$ given by:

$$SR_1 = \left|\frac{dV}{dt}\right|_1 = \frac{(i_p)}{(C_{PAR})} \quad (12)$$

For a second period $P_2''$, which may be taken to represent a second calibration period, the controller 202 closes switch 106, opens reset switch 206 and controls the current source 204 to generate $i_M$ to bias the terminals of the switch 106 and/or actuator element 4 to control the direction of $i_p$ such that a test input comprising $i_p$ will charge the parasitic capacitance $C_{PAR}$.

The controller 202 then opens switch 106 to electrically isolate the actuator element 4 from the test path and closes reset switch 206 and controls current source 204 to prevent $i_M$ from flowing such that $C_{PAR}$ in the test path discharges.

The controller 202 opens reset switch 206, opens switch 106 and controls the current source 204 to generate $i_M$ such that a test input comprising $(i_p+i_M)$ charges the parasitic capacitance $C_{PAR}$ during the second calibration period $P_2''$.

As depicted in FIG. 4b, the voltage $V_X$ rises, during $P_2''$, at a slew rate $SR_2$ given by:

$$SR_2 = \left|\frac{dV}{dt}\right|_2 = \frac{(i_p + i_M)}{(C_{PAR})} \quad (13)$$

Therefore, from (12) and (13):

$$\frac{(SR_2)}{(SR_1)} = \frac{(i_p + i_M)}{(i_p)} \quad (14)$$

For a third period $P_3''$, which may be taken to represent a test period, the controller 202 closes the switch 106 to electrically connect the actuator element 4 to the test path, closes reset switch 206, and controls current source 204 to prevent $i_M$ from flowing such that $C_{PAR}$ in the test path discharges.

Controller 202 opens reset switch 206, closes switch 106 and controls the current source 204 to generate $i_M$ such that a test input comprising $(i_p+i_M)$ charges the combined parasitic and actuator capacitors to a total capacitance $(C_{PAR}+C_{ACT})$ during $P_3''$.

As depicted in FIG. 4b, the voltage $V_X$ rises, during $P_3''$, at a slew rate $SR_3$ given by:

$$SR_3 = \left|\frac{dV}{dt}\right|_3 = \frac{(i_p + i_M)}{(C_{PAR} + C_{ACT})} \quad (15)$$

The slew rate for a given transition period z is given by:

$$SR_z = \frac{(V_{HIGH} - V_{LOW})}{t_z}; \text{ or } t_z = \frac{(V_{HIGH} - V_{LOW})}{SR_z} \quad (16)$$

Therefore, reformulating (14) provides:

$$\frac{(i_p + i_M)}{(i_p)} = \frac{\left(\frac{V_{HIGH} - V_{LOW}}{t_2}\right)}{\frac{(V_{HIGH} - V_{LOW})}{t_1}} = \frac{(t_1)}{(t_2)} \quad (17)$$

Therefore:

$$\frac{(i_M)}{(i_P)} = \frac{(t_1)}{(t_2)} - 1 \quad (18)$$

Furthermore, reformulating (15) and substituting for $SR_3$ provides:

$$C_{ACT} = \frac{(i_M + i_P)t_3}{(V_{HIGH} - V_{LOW})} - C_{PAR} \quad (19)$$

From (12) and (16):

$$i_P = C_{PAR}\frac{(V_{HIGH} - V_{LOW})}{t_1}, \text{ and } C_{PAR} = \frac{i_P t_1}{(V_{HIGH} - V_{LOW})} \quad (20)$$

Substituting for $i_p$ and $C_{PAR}$ from (20) into (19) gives:

$$C_{ACT} = \frac{(i_M + i_P)t_3}{(V_{HIGH} - V_{LOW})} - \frac{i_P t_1}{(V_{HIGH} - V_{LOW})} = \quad (21)$$

$$\frac{i_M t_3 + i_P(t_3 - t_1)}{(V_{HIGH} - V_{LOW})} = \frac{i_M}{(V_{HIGH} - V_{LOW})} \cdot \left[t_3 + \frac{i_P}{i_M}(t_3 - t_1)\right]$$

Reformulating provides:

$$C_{ACT} = \frac{i_M}{(V_{HIGH} - V_{LOW})} \cdot \left[t_3 + \frac{(t_3 - t_1)}{\left(\frac{i_M}{i_P}\right)}\right] \quad (22)$$

Substituting from (18) into (22) provides:

$$C_{ACT} = \frac{i_M}{(V_{HIGH} - V_{LOW})} \cdot \left[t_3 + \frac{(t_3 - t_1)}{\left(\frac{t_1}{t_2} - 1\right)}\right] \quad (23)$$

Reformulating gives:

$$C_{ACT} = \frac{i_M}{(V_{HIGH} - V_{LOW})} \cdot \left[t_3 + \frac{t_2(t_3 - t_1)}{(t_1 - t_2)}\right] \quad (24)$$

From (24), $C_{ACT}$ can be determined from the three measured transition times $t_1$, $t_2$ and $t_3$ together with the controlled current $i_M$ and the set difference between $V_{HIGH}$ and $V_{LOW}$.

In the embodiments described above the values of $V_{HIGH}$ and $V_{LOW}$ are substantially equal for the different periods (e.g. calibration/test period). However, in alternative embodiments the respective values of $V_{HIGH}$ and $V_{LOW}$ may be modified for a given period to increase the accuracy of determining $C_{ACT}$.

Whilst it is possible to control the level shifter of FIG. 3a to prevent $i_p$ from flowing whilst the switch 106 is open, $i_p$ would flow when the switch 106 is closed regardless of level shifter control. However, unless $i_p$ is measured whilst the switch is open, it would not be determinable, and, therefore, would decrease the accuracy of the determined $C_{ACT}$.

FIG. 5a schematically shows a printhead circuit 400 according to a further embodiment, whereby test circuit 402 is incorporated within a switch circuit 404 of the printhead circuit 400, whereby the printhead circuit 400 also includes the actuator element array 105 as previously described.

As above, the actuator element array 105 comprises a plurality of actuator elements 4a-4d arranged in electrical communication with a drive circuit 102 via a bus 107, whereby a switch 106 selectively connects an associated actuator element to a drive path as required.

The test circuit 402 is arranged in electrical communication with the plurality of actuator elements 4a-4d, whereby a test switch 414 selectively connects the test circuit 402 to the bus 107. The test switch 414 may take any suitable form, and may for example comprise one or more transistors.

An actuator element 4 to be tested is also connected to the bus 107 and the test circuit (when switch 414 is closed) by turning on an associated switch 106a-d.

Generally, the test circuit 402 will operate at voltages of approximately 5V, whilst the drive circuit 102 will generate waveforms of >5V. Therefore, the test switch 414 may electrically isolate the test circuit 402 from the drive path, for example when the drive circuit 102 is driving one or more of the actuator elements, so as to prevent the test circuit 402 being damaged by the drive currents/voltages.

The controller 416 may be used to control the test switch 414 (e.g. in response to a signal from the drive circuit or other circuitry).

The test circuit 402 is similar to the test circuits described in FIGS. 2a and 4a, whereby in the present example, the test circuit 402 comprises DACs 418, 419 to generate $V_{HIGH}$ and $V_{LOW}$; comparators 420, 421; and current source 422 to generate constant current $i_M$. The timer is depicted as being integrated into the controller 402.

The test circuit 402 further comprises DAC 423 for generating $V_{SET}$, which when bias switch 425 is closed may bias circuitry on the test path so as to, for example, control the direction of flow of parasitic current $i_p$.

The test circuit 402 may be used to determine the capacitance of one or more of the actuator elements 4, and therefore detect an open circuit across one or more of the actuator elements as described above. An open circuit across an actuator element 4 is also taken to include an open circuit across an electrical track associated with the actuator element, such as electrical track 109.

The test circuit 402 may also be used to detect other faults such as short circuits across an actuator element.

FIG. 5b schematically illustrates detecting a short circuit 430 across the actuator element 4b. Switches 106b and 414 are closed such that actuator element 4b is in electrical communication with the test circuit 402 via a test path.

The current source 422 (as shown in FIG. 5a) is turned on and when there is a short circuit 430 across the actuator element, the actuator element 4b will not charge. Without a short circuit across it, the actuator element 4b will charge and the subsequent discharge of the actuator element will be input from the test path as $V_X$ to the comparators, whereby, in the present example, $V_X \leq V_{LOW}$ is indicative of a short circuit across the actuator element 4b, whilst $V_{LOW} \leq V_X \leq V_{HIGH}$ is indicative of an absence of a short circuit.

However, the test circuit 402 is not limited to measuring the discharge from a particular actuator element to detect a short circuit (or no short circuit) across it, and in alternative examples different measurements may be taken to indicate such a short circuit. As an illustrative example, $V_X$ not reaching a threshold level within a specified time period may be indicative of a short circuit across the actuator element.

In the present embodiment, each actuator element 4 is also coupled to an associated discharge switch 424 which may be used to discharge (e.g. to ground) its associated actuator element 4 when closed and connected to ground, for example.

A discharge switch 424 may comprise a transistor and may be provided within the switch logic 404 controlled by the controller 416. By controlling the discharge switches appropriately, the test circuit 402 may also be used to detect short circuits between actuator elements (e.g. neighbouring actuator elements) in the actuator element array 105 (which may also include short circuits between electrical tracks 109 of the actuator elements).

FIG. 5c schematically illustrates detecting a short circuit between actuator elements 4b and 4c (depicted as short circuit 432), whereby switches 106b and 414 are closed such that actuator element 4b is in electrical communication with the test circuit 402 via a test path. Discharge switch 424c is also closed to provide a path to discharge the actuator element 4c.

The current source 422 (as shown in FIG. 5a) is turned on, and when there is a short circuit 432 present between adjacent actuator elements 4b and 4c, the discharge switch 424c will provide a discharge path and the actuator element 4b will not charge. In the absence of a short circuit, the actuator element 4b will charge and the subsequent discharge will be input from the test path as $V_X$ to the comparators, whereby, for the present example, $V_X \leq V_{LOW}$ is indicative of a short circuit across the actuator elements 4b and 4c, whilst $V_{LOW} \leq V_X \leq V_{HIGH}$ is indicative of an absence of a short circuit. It will be understood that such test is not limited to adjacent actuator elements, but may include testing between any number of is actuator elements in the actuator element array 105.

However, the test circuit 402 is not limited to measuring the discharge from a particular actuator element to detect a short circuit (or absence of a short circuit) between actuator elements, and in alternative examples different measurements may be taken to detect such a short circuit. For example, $V_X$ not reaching a threshold level within a specified time period may be indicative of a short circuit between actuator elements.

FIG. 6 schematically shows a printhead circuit 500 according to a further embodiment, whereby test circuit 502 is incorporated within a switch circuit 504 of the printhead circuit 500, and whereby the printhead circuit 500 also includes actuator element array 105 as previously described.

As above, the actuator element array 105 comprises a plurality of actuator elements 4a-4d arranged in electrical communication with a drive circuit 102 via a bus 107, whereby a switch 106 selectively connects an associated actuator element to the bus 107.

The test circuit 502 is similar to the test circuit described in FIG. 5a, whereby in the present example, the test circuit 502 comprises DACs 518, 519 to generate $V_{HIGH}$ and $V_{LOW}$; comparators 520, 521; current source 522 to generate constant current $i_M$; DAC 523 for generating $V_{SET}$; and bias switch 525.

Therefore, it will be seen that the test circuit 502 may be used to determine the capacitance of one or more of the actuator elements 4, detect an open circuit across an actuator element and/or detect a closed circuit across/between actuator elements.

In the present embodiment the actuator elements 4a-4d are arranged in electrical communication with the test circuit 502 via a dedicated test bus 509, whereby a test switch 511 selectively connects an associated actuator element to the test bus 509 as required. The test switches 511 may take any suitable form, and may for example comprise one or more transistors. The test switches 511 are controllable by the controller 516 and/or may be controlled by other circuitry.

As will be appreciated, the test bus 509 will have an associated capacitance 513, which will be taken to be a parasitic capacitance for the purposes of measuring the capacitance of an actuator element and detecting an open circuit.

In the present embodiment the test circuit 502 includes a discharge switch 517 in electrical communication with test bus 509 for discharging the parasitic capacitance 513 as necessary.

The test bus 509 arrangement provides for increased electrical isolation between the test bus 509 and the drive circuit 102, because when the test circuit 502 is performing a diagnostic test on an actuator element, the switches 106 can be controlled (e.g. by the controller in the test circuit, a controller in the drive circuit or other suitable control circuitry) to ensure the drive circuit 102 is electrically isolated from the test circuit 502.

Furthermore, as described above, it may be advantageous to minimise the ON resistance of the switches 106. However, minimising the ON resistance of a switch increases the parasitic capacitance thereof.

As the test switches 511 are used to connect the actuator elements 4 to the test bus 509 and are controlled to be open whilst the drive circuit 102 drives the actuator elements 4, the test switches 511 have substantially no impact on the drive waveform. Therefore, the ON resistance of the test switches 511 can be higher in comparison to the switches 106, and the parasitic capacitance of the test switches 511 can be reduced in comparison to the switches 106.

Therefore, the parasitic capacitance of a test path via test bus 509 can be reduced in comparison to the parasitic capacitance of a test path via bus 107 described in FIG. 5a. As a result, the sensitivity of the diagnostic tests, and in particular the accuracy in the determination of $C_{ACT}$ for a particular actuator element, may be improved for a test path via a dedicated test bus 509.

FIG. 7a schematically shows a printhead circuit 600 according to a further embodiment, whereby test circuit 602 is incorporated within a switch circuit 604 of the printhead circuit 600, whereby the printhead circuit 600 also includes actuator element array 105 as previously described.

FIG. 7b schematically shows an example of a common drive waveform 650, and trimmed waveform 652 obtained using switch 606.

The test circuit 602 is similar to the test circuit described in FIG. 6, whereby in the present example, the test circuit 602 comprises DACs 618, 619 to generate $V_{HIGH}$ and $V_{LOW}$; comparators 620, 621; current source 622 to generate constant current $i_M$; DAC 623 for generating $V_{SET}$; and bias switch 625.

Therefore, it will be seen that the test circuit 602 may be used to determine the capacitance of one or more of the actuator elements 4, detect an open circuit across an actuator element and/or detect a closed circuit across/between actuator elements.

In some embodiments, the shape of the drive waveform may be required to be modified, or 'trimmed', so as to, for example, adjust the droplet velocity and/or volume of the droplet.

To achieve such trimming, the drive circuit 102 may modify a common drive waveform applied to all actuator elements. However, some applications require that the drive waveform is modified on a per actuator element basis.

In the example of FIG. 7a, switch elements 660 and 662 are arranged in parallel with switch element 664 in a passgate configuration, whereby switch elements 660 and 662 have a higher ON resistance in comparison to switch element 664.

The switch elements 660, 662 and 664 may be controlled by the controller 616 in the test circuit 602, a controller in the drive circuit (not shown) or other suitable control circuitry.

Switch elements 660, 662 & 664 are configured to selectively pass common drive waveform 650 from the drive circuit 102 to a corresponding actuator element 4. The ON resistance of the switch element 664 may be minimised so as to obtain a desired waveform shape (e.g. having defined leading/trailing edges and slew rates).

During printhead operation, the low ON resistance switch element 664 is closed and high ON resistance switch elements 660, 662 are open such that a common drive waveform passes through the switch element 664 and is applied to an associated actuator element 4.

To trim the common drive waveform, the low ON resistance switch element 664 is opened and the high ON resistance switch elements 660, 662 are closed whilst the common drive waveform passes through the switch element.

The high ON resistance switch elements 660, 662 modify the common drive waveform 650 as it passes therethrough (depicted as creating a step 654 in FIG. 7b). When the desired trimming is complete the switch element 664 is closed and switch elements 660, 662 opened, whereby the remainder of the common drive waveform 650 will pass through the low ON resistance switch element 664 to be applied to the actuator element via the switch element 664.

In the present illustrative example, dedicated test bus 609 is connected to the common connection 617 between the high ON resistance switch elements 660 and 662 of each switch 606.

To connect a particular actuator element 4 to the test path, the high ON resistance switching element 662 of a corresponding switch 606 is controlled to be closed, whilst the other switching elements 660 & 664 of the corresponding switch are controlled to be open.

It will be seen therefore that the high ON resistance switching element 662 is not a dedicated test switch element or a dedicated drive switch element but is used for connecting the actuator element to both a drive path and a test path.

As test circuit 602 is electrically isolated from the drive circuit 102, it will not be damaged by the drive voltage/currents whilst the drive waveform is passed by the low ON resistance switch element 664.

In the present illustrative example both of the high ON resistance switching elements 660 and 662 are closed when trimming the drive waveform for an associated actuator element 4, whereby the resistance between the drive circuit 102 and the associated actuator element 4 is independent of the number of actuator elements being trimmed at the same time.

Whilst one or more of the high ON resistance switching elements 660a-660d may be merged together to provide a single switch element, it will be appreciated that in such an arrangement the effective resistance of such a single switching element will be a function of the number of the merged switch elements 660 in addition to the number of the high ON resistance switching switch elements 662 that are closed at any one time (i.e. when the drive waveforms of one or more actuator elements are being trimmed).

FIG. 7c schematically shows a printhead circuit 600 according to a further embodiment, whereby test circuit 602 is incorporated within a switch circuit 604 of the printhead circuit 600, whereby the printhead circuit 600 also includes actuator element array 105 as previously described.

FIG. 7d schematically shows an example of a common drive waveform 650, and trimmed waveform 652 obtained using switch 606.

In the illustrative example of FIG. 7c, each switch 606 comprises switch element 660', switch element 662' and switch element 664' arranged in a compound passgate configuration, whereby switch element 662' is arranged in parallel with switch element 664'.

In the present illustrative example switch elements 660' and 662' have a lower ON resistance in comparison to switch element 664'. As above, the switch elements 660', 662' and 664' may be controlled by the controller 616 in the test circuit 602, a controller in the drive circuit (not shown) or other suitable control circuitry.

The operation of switch 606 to drive an actuator element with drive waveform 652 is described in relation to FIG. 7d which shows a timing diagram for a basic implementation of a slew controlled step-based trimming scheme of a CDW 650.

The CDW 650 comprises a pulse which may have any shape. The resulting drive waveform 652 also has a pulse.

In the present illustrative example, there is the step 654 in the leading edge of the pulse of the CDW 650, the step being at a voltage $V_{HOLD}$.

Timing of the switch elements 660', 662', 664' to obtain drive waveform 652 is indicated in the two horizontal bars 656, 658, the top bar 656 showing the state of switch elements 660' & 664', and the lower bar 658 showing the state of switch element 662'.

Both horizontal bars 656 & 658 show that switch elements 660', 662', 664' are closed for the leading edge of the pulse in the CDW 650. This means that the ON resistance of the passgate is determined by switch element 660' and switch element 662'.

The switch elements are opened after the start of the flat portion of the step 654 (shown in hashing), during which the actuator element 4 is decoupled from the drive path and so the step in the pulse of the drive waveform 652 is prolonged for a controlled duration $T_{TRIM}$ and does not follow the end of the step 654 in the CDW 650.

The end of the step 650 in the drive waveform 652 is caused by recoupling the actuator element 4 to the drive path after a controlled duration $T_{TRIM}$, and the drive waveform 652 voltage drops from $V_{HOLD}$ down to follow the voltage $V_{LOW}$ of the bottom of the pulse in the CDW 650. The $V_{HOLD}$ to $V_{LOW}$ transition is enabled by turning ON only one half of the passgate, namely switch element 660' and switch element 664'.

Since the switch element 664' has a higher ON resistance in comparison to the switch element 660', the ON resistance of the passgate for this transition will be increased. This enables slowing the $V_{HOLD}$ to $V_{LOW}$ transition without compromising the $V_{HIGH}$ to $V_{HOLD}$ transition. The timing of the step duration $T_{TRIM}$, and hence the amount of trimming, is determined by the timing of when switch elements 660' and 664' turn ON (the transition highlighted by the circle in FIG. 7d).

Dedicated test bus 609 is coupled to the switch elements 662' and 664' of each switch 606.

To couple a particular actuator element 4 to a test path, the switch element 660' of the corresponding switch 606 is controlled to be open, whilst the switch elements 662' and 664' are controlled to couple the actuator element 4 to the test path dependent on a required rise/measurement time. Furthermore, in the present illustrative example a test switch 610 is arranged to selectively connect the test circuit 602 to the test bus 609. The test switch 610 may take any suitable form, and may for example comprise one or more transistors.

For example, due to the respective $R_{ON}$ resistances of switch element 662' & 664', opening the switch element 662' and closing the switch element 664' will provide the longest rise/measurement time; closing the switch element 662' and opening the switch element 664' will provide a shorter rise/measurement time; whilst closing both switch elements 662' & 664' provides the shortest rise/measurement time.

It will be seen therefore that the switch elements 662' & 664' are not dedicated test switch elements or dedicated drive switch elements but are used for connecting the actuator element 4 to both a drive path and a test path, whilst controlling the switch elements 662' & 664' provides for variations in rise/measurement time.

Note that for the schematic examples of FIGS. 7a and 7c, switch elements 660', 662' and 664' are shown as simple switch logic for illustrative purposes only and, in practice, these may be implemented as MOS devices or any suitable device.

FIG. 8 schematically shows a test circuit 702 implemented as a dedicated circuit such as on a printed circuit board (PCB). The PCB may be inserted into a printer, printhead or may, for example, be used as part of a discrete test module which connects to the printer/printhead.

The test circuit 702 is similar in configuration and functionality to the test circuit described in FIG. 7a, whereby in the present illustrative example, the test circuit 702 comprises an electrical track 708 which may be provided in electrical communication with actuator elements on a printhead circuit (not shown) via terminal 728.

The test circuit 702 comprises a controller 716 which, as above, controls the circuitry of the test circuit 702. The controller 702 also generates signals used to control one or more external circuits or components thereof, such as to control individual switches in switch circuitry on a printhead circuit via terminal 730.

Test circuit 702 comprises measurement circuit 705 which includes DACs 718, 719 to generate $V_{HIGH}$ and $V_{LOW}$ (as determined by the controller 716); comparators 720, 721 which compare a measured value $V_X$ to respective DAC outputs; and timer 712 which times the transition of $V_X$ from $V_{LOW}$ to $V_{HIGH}$ and provides the result to the controller 716. As above, the timer 712 may be implemented in an FPGA or may be a dedicated IC.

The test circuit 702 further comprises programmable current source 722 to generate constant current $i_M$ as determined by, for example, the controller 716. As above, in embodiments the current source 722 has a high output impedance for linear charging of the actuator elements to improve the accuracy of the capacitance measurement.

The test circuit 702 further comprises DAC 723 for generating $V_{SET}$ and bias switch 725 as described previously.

A power supply 727 supplies a suitable voltage for the current source 722. The power supply 727 may also supply voltages to external circuitry, such as a printhead circuit, via terminal 729. Such voltages supplied by power supply 727 may be dependent on a given application, and may range from, for example, 1.8V to 40V.

The controller 716 may communicate with further external circuitry (e.g. computer terminal) via communications circuitry 732 and terminal 734. The circuitry may comprise a communications interface comprising a serial link (e.g. a universal serial bus (USB) to serial link). As will be appreciated, further circuitry/terminals not described herein may be required to send/receive/generate signals as required e.g. as may be required by a particular communications protocol. As an illustrative example, an I²C protocol may require clock signals to be generated by the test circuit 702.

It will be appreciated that the test circuit 702 may be used to perform diagnostic tests to determine the capacitance $C_{ACT}$ of an actuator element and/or detect a fault such as an open circuit across the actuator element or a closed circuit across/between actuator elements. The number of actuator elements in the accompanying examples is not limited to four, but may equally apply to any number of actuating elements.

A precision circuit 736 may be provided within the test circuit 702, whereby the precision circuit may be arranged in electrical communication with an external measurement circuit or device which could measure the currents and voltages generated within the test circuit 702 more accurately than would otherwise be achieved with the intrinsic accuracy of test circuit itself.

In the present illustrative example, precision circuit 736 comprises a precision switch array 738 which is used to selectively connect the current source 722 and the output of each DAC 718, 719 to terminal 740, such that an external measurement circuit/device, such as a digital voltmeter (DVM) (e.g. within the printhead circuit or remote from the printer), may be connected to terminal 740 to measure $i_M$, $V_{HIGH}$ and $V_{LOW}$ more accurately than would otherwise be achieved with the intrinsic accuracy of the current source 722 and DACs 720, 721. The DVM may then communicate with the controller 716 to adjust the outputs from the current source 722, DAC 720 and/or DAC 721 in response to the measured values.

In the present illustrative example, $i_M$ is measured from the voltage drop across precision resistor configuration 742 when precision switch 744 is closed e.g. by controller 716. It will also be understood that such a precision circuit may be included in the other test circuits described above in FIGS. 2a to 7a.

Whilst the embodiments above disclose determining capacitance or detecting faults based on, or in response to, time measurements, the invention is not limited to time measurements.

As an example, the comparators in a test circuit may be replaced with an analog to digital converter (ADC). Taking the test circuit of FIG. 2a as an illustrative example, replacing the comparators with an ADC, the voltage $V_X$ is an analog input to the ADC. The controller would then control the constant source for a certain amount of time such that the capacitance ($C_{PAR}$ and/or $C_{ACT}$) charges in response thereto. Instead of measuring time transitions, the controller would measure the digital signal from the ADC in response to the variations in the measured voltage. However, as will be appreciated, the accuracy of such measurements will be dependent on the number of bits of the ADC.

The test circuits described in the embodiments above may perform diagnostic tests to determine the capacitance $C_{ACT}$ of an actuator element and/or detect a fault such as an open circuit across the actuator element (including across an associated electrical track) or a closed circuit across/between actuator elements.

In embodiments, such test circuits described above may be located remote from the printer and configured to test the actuator elements in a printhead circuit so as to determine the capacitance/detect any faults pre or post assembly of the printhead circuit into the printer.

In other embodiments the test circuit may be integrated into the printer (e.g. as part of the printhead circuit as depicted in FIGS. 5a, 6 and 7a), whereby diagnostic testing may be performed before or after printing (e.g. as part of an initialisation, standby, shutdown routine and/or in between print runs).

In embodiments, on detecting a fault on an actuator element(s), the test circuit (or other circuitry on the printer) may perform a fault action.

Such a fault action may include generating an alert for user. Such an alert may be notification on a user screen identifying the fault. In alternative embodiments, a fault action may include the printer operating with limited functionality until a user addresses the faults e.g. by replacing the printhead circuit.

In alternative embodiments, a fault action may comprise the test circuit (or other circuitry on the printer) preventing a particular actuator element(s) from being driven by the drive circuit (e.g. by controlling associated switches appropriately).

The fault action may also include the drive circuit using any suitable techniques to compensate for any detected faults as appropriate, e.g. by increasing the droplet volumes ejected from one or more neighbouring nozzles.

Furthermore, an actuator element will age over time, whereby the achievable drop velocity will decrease in response to a set drive voltage until the actuator element fails. In practice, the drive voltage may be increased to compensate for the decreased drop velocity. However, increasing the drive voltage will shorten the lifetime of the actuator element.

The capacitance of an actuator element also decreases over time (e.g. due to aging and wear) and generally tracks the drop velocity. Therefore, by recording the capacitance over time, it is possible to determine and/or predict how close the actuator element is to failure.

One method for predicting failure is to determine the capacitance of the actuator element periodically, store the determined capacitance values as capacitance history data (e.g. as a function of time) in storage circuitry (e.g. on the test circuit or printhead circuit), and to set a capacitance threshold. Reaching the threshold may be taken to be a fault and an appropriate fault action initiated accordingly.

Therefore, in embodiments the determined capacitance history data of an actuator element may be used to track the operation of the actuator element over time and to predict a future failure thereof.

It will be understood that the functionality of actuator elements may be modified based on an analysis of the stored capacitance history data, whereby the drive waveform may be adjusted/trimmed in response to the capacitance history. Such an analysis may be undertaken by the printhead circuit, the test circuit or any other suitable circuitry.

As above, the capacitance may be determined periodically and capacitance history data stored, for example as part of an initialisation, standby or shutdown routine. Alternatively, the capacitance may be determined between print runs whilst the actuator element is not connected to a drive circuit.

Where the term "comprising" is used in the present description and claims, it does not exclude other elements or steps and should not be interpreted as being restricted to the means listed thereafter.

Where an indefinite or definite article is used when referring to a singular noun e.g. "a" or "an", "the", this includes a plural of that noun unless something else is specifically stated.

In a further alternative, the preferred embodiment of the present techniques may be realized in the form of a data carrier having functional data thereon, said functional data comprising functional computer data structures to, when loaded into a computer system or network and operated upon thereby, enable said computer system to perform all the steps of the method.

It will be clear to one skilled in the art that many improvements and modifications can be made to the foregoing exemplary embodiments without departing from the scope of the present techniques.

The invention claimed is:

1. A test circuit to determine the capacitance of at least one actuator element in an array, wherein the test circuit comprises:
   a controller;
   a source to generate test inputs;
   measurement circuitry to measure one or more test values on a test path between the test circuit and the at least one actuator element;
   wherein the controller is configured to, for a test period:
      control a first switch associated with the at least one actuator element to connect the at least one actuator element to the test path;
      control the source to generate a first test input;
      determine a total capacitance from a first test value generated in response to the first test input; the total capacitance comprising a capacitance of the at least one actuator element and a parasitic capacitance associated with the at least one actuator element; and
      determine the capacitance of the at least one actuator element from the total capacitance.

2. The test circuit according to claim 1, wherein the controller is further configured to, for the test period:
   control a second switch, associated with a second actuator element, to connect the second actuator element to the test path when the test path and the second actuator element are in short circuit.

3. The test circuit according to claim 1, wherein the controller is further configured to:
   detect a fault associated with the at least one actuator element in response to one or more of: the test values and the determined capacitance.

4. The test circuit according to claim 3, wherein the fault comprises one or more of:
   an open circuit, a short circuit across the at least one actuator element, and a short circuit between the test path and further actuator element.

5. The test circuit according to claim 1, wherein the controller is further configured to, for a first calibration period:
   control the first switch to isolate the at least one actuator element from the test path;
   control the source to generate a second test input on the test path to charge the parasitic capacitance;
   determine the parasitic capacitance based on a second test value generated in response to the second test input,
   wherein the parasitic capacitance is used to determine the capacitance of the actuator element from the total capacitance.

6. The test circuit according to claim 1, wherein the first test value is further determined based in a response to the first test input and a parasitic current.

7. The test circuit according to claim 6, wherein the controller is further configured to, for a first calibration period:
control the source to bias the parasitic current away from the at least one actuator element;
control the first switch to electrically isolate the at least one actuator element from the test path;
control the source to charge the parasitic capacitance with the parasitic current; and
generate a second test value in response to charging an associated parasitic capacitance with the parasitic current.

8. The test circuit according to claim 7, wherein the controller is further configured to, for a second calibration period:
control the source to bias the parasitic current away from the at least one actuator element;
control the first switch to electrically isolate the at least one actuator element from the test path;
control the source to charge the parasitic capacitance with the parasitic current and a second test input; and
generate a third test value in response to charging the parasitic capacitance with the parasitic current and the second test input.

9. The test circuit according to claim 8, wherein the second test value and the third test value are used to determine the capacitance of the at least one actuator element from the total capacitance.

10. The test circuit according to claim 1, wherein an estimate of the parasitic capacitance is used to determine the capacitance of the actuator element from the total capacitance.

11. The test circuit according to claim 1, wherein the measurement circuitry comprises: one or more comparators each arranged to receive the one or more test values on the test path and a set level input.

12. The test circuit according to claim 11, wherein
the measurement circuitry further comprises a timer arranged to receive an output from the one or more comparators, and
the timer is configured to measure at least one of:
the transition time of the first test value from a first set level to a second set level,
the transition time of the second test value from a third set level to a fourth set level,
and the transition time of the third test value from a fifth set level to a sixth set level.

13. The test circuit according to claim 1, wherein the test circuit further comprises a test switch arranged to electrically isolate the test circuit from the test path.

14. The test circuit according to claim 1, wherein the test circuit further comprises a precision circuit to selectively provide the one or more test inputs to a further measurement circuit.

15. The test circuit according to claim 1, wherein the test circuit further comprises a discharge switch configurable to discharge the test path.

16. The test circuit according to claim 1, wherein
the source comprises a constant current source; and
the first test input comprises a constant current.

17. A droplet deposition head circuit comprising:
an actuator element assembly comprising at least one actuator element;
a switch circuit comprising a plurality of switches for selectively connecting the at least one actuator element to a test path or a drive path; and
a test circuit configured to:
determine a capacitance of the at least one actuator element from a total capacitance when the at least one actuator element is connected to the test path,
wherein the total capacitance comprises the capacitance of the at least one actuator element and a parasitic capacitance associated with the at least one actuator element.

18. The droplet deposition head circuit according to claim 17, wherein the test circuit comprises:
a controller;
a source to generate test inputs for the test path; and
measurement circuitry configured to measure one or more test values on the test path generated in response to the test inputs.

19. The droplet deposition head circuit according to claim 17, wherein the test path comprises a first test bus between the test circuit and the at least one actuator element.

20. The droplet deposition head circuit according to claim 19, wherein the drive path comprises the first test bus.

21. The droplet deposition head circuit according to claim 19, wherein the drive path further comprises a second test bus between a drive circuit and the at least one actuator element.

22. The droplet deposition head circuit according to claim 17, wherein the test path comprises a test switch for electrically isolating the test circuit from the drive path.

23. The droplet deposition head circuit according to claim 22, wherein
a first test bus is coupled between a first switch element and a second switch element of the plurality of switches, and
the first switch element is configured to electrically isolate the test circuit from the drive path.

24. The droplet deposition head circuit according to claim 23, wherein the plurality of switches further comprise a third switch element arranged in parallel with the first switch element.

25. The droplet deposition head circuit according to claim 24, wherein the first test bus is coupled between the second and third switch elements, and the test switch is provided on the first test bus.

26. A test module comprising a test circuit to determine the capacitance of at least one actuator element in an array, wherein the test circuit comprises:
a controller;
a source to generate test inputs;
measurement circuitry to measure one or more test values on a test path between the test circuit and the at least one actuator element;
wherein the controller is configured to, for a test period:
control a first switch associated with the at least one actuator element to connect the at least one actuator element to the test path;
control the source to generate a first test input;
determine a total capacitance from a first test value generated in response to the first test input, the total capacitance comprising the capacitance of the at least one actuator element and a parasitic capacitance associated with the at least one actuator element; and
determine the capacitance of the at least one actuator element from the total capacitance.

* * * * *